(12) United States Patent
Ahn et al.

(10) Patent No.: US 11,296,277 B2
(45) Date of Patent: Apr. 5, 2022

(54) VARIABLE RESISTANCE MEMORY DEVICE HAVING AN ANTI-OXIDATION LAYER AND A METHOD OF MANUFACTURING THE SAME

(71) Applicant: SAMSUNG ELECTRONICS CO., LTD., Suwon-si (KR)

(72) Inventors: Sanghoon Ahn, Suwon-si (KR); Oik Kwon, Suwon-si (KR); Jeonghee Park, Suwon-si (KR); Kihyun Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 30 days.

(21) Appl. No.: 16/589,456

(22) Filed: Oct. 1, 2019

(65) Prior Publication Data

US 2020/0119259 A1   Apr. 16, 2020

Related U.S. Application Data

(60) Provisional application No. 62/746,220, filed on Oct. 16, 2018.

(30) Foreign Application Priority Data

Apr. 1, 2019 (KR) .......... 10-2019-0037630
May 23, 2019 (KR) .......... 10-2019-0060777

(51) Int. Cl.
*H01L 43/08* (2006.01)
*H01L 27/22* (2006.01)
(Continued)

(52) U.S. Cl.
CPC .......... *H01L 43/08* (2013.01); *H01L 27/222* (2013.01); *H01L 27/2463* (2013.01); *H01L 43/10* (2013.01); *H01L 43/12* (2013.01); *H01L 45/1253* (2013.01); *H01L 45/141* (2013.01); *H01L 45/1675* (2013.01); *H01L 45/1691* (2013.01)

(58) Field of Classification Search
CPC ... H01L 27/222; H01L 27/2463; H01L 43/10; H01L 43/12; H01L 45/1253; H01L 45/141; H01L 45/1675; H01L 45/1691
See application file for complete search history.

(56) References Cited

U.S. PATENT DOCUMENTS 8,716,818 B2 * 5/2014 Yoshikawa .......... H01L 43/12
257/421
8,859,393 B2   10/2014 Ries et al.
(Continued)

*Primary Examiner* — Peter Bradford
(74) *Attorney, Agent, or Firm* — F. Chau & Associates, LLC

(57) ABSTRACT

A variable resistance memory device is provided including a plurality of lower electrodes disposed on a substrate. A plurality of variable resistors are disposed on the plurality of lower electrodes. A plurality of upper electrodes are disposed on the plurality of variable resistors. An interlayer insulating layer fills a space in the plurality of variable resistors. An anti-oxidation layer is disposed between the plurality of variable resistors and the interlayer insulating layer. The anti-oxidation layer covers side surfaces of the plurality of variable resistors, and the anti-oxidation layer comprises silicon and/or carbon.

16 Claims, 13 Drawing Sheets

(51) Int. Cl.
  *H01L 27/24* (2006.01)
  *H01L 45/00* (2006.01)
  *H01L 43/12* (2006.01)
  *H01L 43/10* (2006.01)

(56) References Cited

U.S. PATENT DOCUMENTS

| | | | |
|---|---|---|---|
| 9,397,143 B2 | 7/2016 | Rocklein et al. | |
| 10,026,890 B2 | 7/2018 | Kim et al. | |
| 2004/0201108 A1* | 10/2004 | Kanamura | H01L 21/02126 257/774 |
| 2006/0019487 A1* | 1/2006 | Leuschner | H01L 21/76874 438/637 |
| 2006/0022286 A1* | 2/2006 | Leuschner | H01L 43/12 257/421 |
| 2008/0213990 A1 | 9/2008 | Oh et al. | |
| 2008/0248263 A1 | 10/2008 | Kobrin | |
| 2009/0261433 A1* | 10/2009 | Kang | H01L 43/02 257/421 |
| 2009/0261437 A1* | 10/2009 | Kang | G11C 11/161 257/422 |
| 2011/0156181 A1* | 6/2011 | Takeuchi | H01L 43/12 257/421 |
| 2014/0284540 A1* | 9/2014 | Suguro | H01L 27/2409 257/4 |
| 2014/0353568 A1* | 12/2014 | Boniardi | H01L 45/1608 257/4 |
| 2015/0179706 A1* | 6/2015 | Rocklein | H01L 45/1233 257/4 |
| 2015/0287916 A1 | 10/2015 | Campbell et al. | |
| 2016/0005966 A1* | 1/2016 | Kim | H01L 21/02348 438/127 |
| 2017/0092847 A1* | 3/2017 | Kim | H01L 43/12 |
| 2017/0104152 A1* | 4/2017 | Bae | H01L 43/12 |
| 2018/0097177 A1* | 4/2018 | Chang | H01L 45/12 |
| 2018/0123029 A1 | 5/2018 | Park et al. | |

\* cited by examiner

VARIABLE RESISTANCE MEMORY DEVICE HAVING AN ANTI-OXIDATION LAYER AND A METHOD OF MANUFACTURING THE SAME

CROSS-REFERENCE TO RELATED APPLICATIONS

This U.S. non-provisional patent application claims priority under 35 U.S.C. § 119 to U.S. Provisional Patent Application No. 62/746,220, filed on Oct. 16, 2018 and Korean Patent Applications No. 10-2019-0037630, filed on Apr. 1, 2019, and Korean Patent Application No. 10-2019-0060777, filed on May 23, 2019, the disclosures of which are incorporated by reference herein in their entireties.

TECHNICAL FIELD

The present disclosure provided herein relates to a memory device, and more particularly, to a variable resistance memory device including an anti-oxidation layer and a method of manufacturing the same.

DISCUSSION OF RELATED ART

As a semiconductor device becomes highly integrated, a memory having high performance, such as fast operation and a low operating voltage, is required. Recently, as novel memory devices, memory devices having variable resistance characteristics are being developed. For example, as variable resistance memory devices, a phase change random access memory (PRAM) device, a magnetoresistive random access memory (MRAM), and a resistive random access memory (RRAM) have been developed. However, oxidation of a memory cell in manufacturing of a high-performance memory device may occur.

SUMMARY

The exemplary embodiments of the present inventive concept are directed to providing a variable resistance memory device including an anti-oxidation layer and a capping layer which covers a variable resistor.

In addition, the exemplary embodiments of the present inventive concept are directed to providing a method of manufacturing a variable resistance memory device including forming an anti-oxidation layer and a capping layer.

According to an exemplary embodiment of the present inventive concept, a variable resistance memory device is provided including a plurality of lower electrodes disposed on a substrate. A plurality of variable resistors are disposed on the plurality of lower electrodes. A plurality of upper electrodes are disposed on the plurality of variable resistors. An interlayer insulating layer fills a space in the plurality of variable resistors. An anti-oxidation layer is disposed between the plurality of variable resistors and the interlayer insulating layer. The anti-oxidation layer covers side surfaces of the plurality of variable resistors, and the anti-oxidation layer comprises silicon and/or carbon.

According to an exemplary embodiment of the present inventive concept, a variable resistance memory device is provided including a plurality of word lines disposed on a substrate, each of the plurality of word lines extends primarily in a first direction. A plurality of bit lines are disposed on the substrate, each of the plurality of bit lines extends primarily in a second direction intersecting the first direction. A plurality of memory cells, at least one of which comprises a variable resistor. The at least one memory cell is disposed at an intersection between the word lines and the bit lines. An interlayer insulating layer fills a space between the plurality of memory cells. An anti-oxidation layer covers side surfaces of the memory cells. A capping layer is disposed on the anti-oxidation layer. The anti-oxidation layer and the capping layer cover a lower surface of the interlayer insulating layer, and the anti-oxidation layer comprises silicon and/or carbon.

According to an exemplary embodiment of the present inventive concept, a method of manufacturing a variable resistance memory device is provided including forming a plurality of first conductive lines with an insulating pattern disposed neighboring first conductive lines of the plurality of first conductive lines. A stacked structure is formed including a lower electrode layer, a variable resistance layer, and an upper electrode layer, which are sequentially stacked on the plurality of first conductive lines and the insulating pattern. The stacked structure is etched to form a plurality of memory cells, each comprising a lower electrode, a variable resistor, and an upper electrode. An anti-oxidation layer is formed covering each of the lower electrode, the variable resistor, and the upper electrode. A capping layer is formed covering the anti-oxidation layer. An interlayer insulating layer is formed which fills a space between neighboring memory cells of the plurality of memory cells. The anti-oxidation layer comprises silicon and/or carbon.

BRIEF DESCRIPTION OF THE FIGURES

The above and other features of the present inventive concept will become more apparent to those of ordinary skill in the art with reference to the following detailed description when considered in conjunction with the accompanying drawings, in which.

DETAILED DESCRIPTION OF THE EMBODIMENTS

Figure 1:
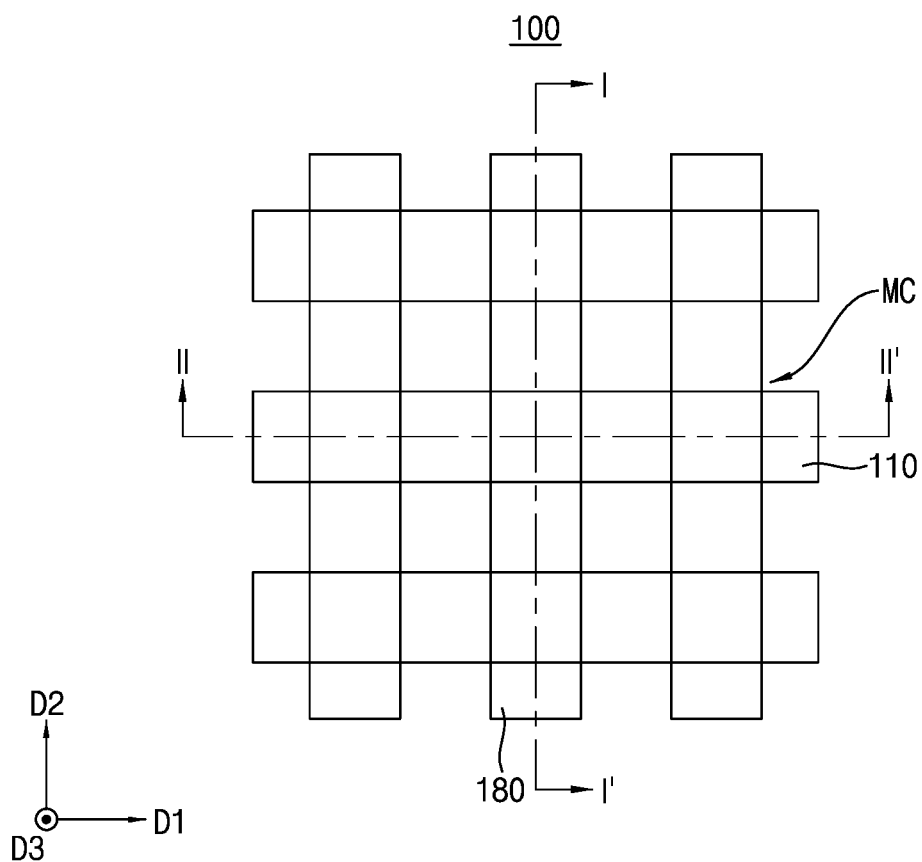
FIG. 1 is a plan view illustrating a memory cell array according to an exemplary embodiment of the present inventive concept.
Figure 2:
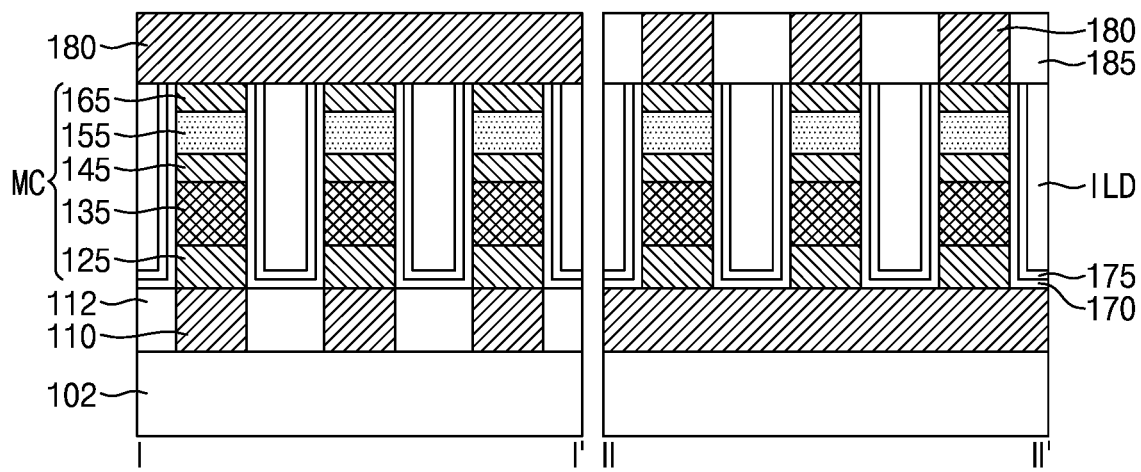
FIG. 2 is cross-sectional views illustrating a variable resistance memory device taken along lines I-I' and II-II' of FIG. 1 according to an exemplary embodiment of the present inventive concept.

FIG. 1 is a plan view illustrating a memory cell array according to an exemplary embodiment of the present inventive concept. FIG. 2 shows cross-sectional views of a variable resistance memory device according to an exemplary embodiment of the present inventive concept. For example, FIG. 2 shows cross-sectional views of the variable resistance memory device taken along lines I-I' and II-II' of FIG. 1. For example, line I-I' may extend in a second direction (e.g., a D2 direction) and the line II-II' may extend in a first direction (e.g., a D1 direction) orthogonally intersecting the line represented by line I-I'.

Referring to FIGS. 1 and 2, a variable resistance memory device 100 according to the exemplary embodiment of the present inventive concept may include first conductive lines 110, second conductive lines 180, and memory cells MC. The first conductive line 110 may extend in a first direction (e.g., a D1 direction). The second conductive line 180 may extend in the second direction (e.g., the D2 direction) intersecting the first direction (e.g., the D1 direction) and may cross the first conductive line 110. The memory cell MC may be disposed at an intersection of the first conductive line 110 and the second conductive line 180.

According to an exemplary embodiment of the present inventive concept, the first conductive line 110 may be a word line and the second conductive line 180 may be a bit line. Alternatively, the first conductive line 110 may be a bit line and the second conductive line 180 may be a word line. Referring again to FIG. 2, the variable resistance memory device 100 may include a substrate 102, the first conductive line 110, an insulating pattern 112, the memory cell MC, the second conductive line 180, and an insulating layer 185. The variable resistance memory device 100 may further include an interlayer insulating layer ILD, an anti-oxidation layer 170, and a capping layer 175.

The substrate 102 may include a semiconductor substrate such as a silicon substrate, a germanium substrate, a silicon-germanium substrate, a silicon-on-insulator (SOI) substrate, or the like. The substrate 102 may also include a group II-V compound such as InP, GaP, GaAs and/or GaSb.

The first conductive line 110 may be disposed on the substrate 102 and may extend in the first direction (e.g., the D1 direction). A plurality of first conductive lines 110 may be spaced apart from each other in the second direction (e.g., the D2 direction). The insulating pattern 112 may be disposed on the substrate 102 and may extend in the first direction (e.g., the D1 direction). The insulating pattern 112 may be disposed between the plurality of first conductive lines 110 and may electrically insulate the plurality of first conductive lines 110 from each other. For example, the insulating pattern 112 may have upper, lower, and parallel side surfaces. The upper surface and lower surface of the insulating pattern 112 may be spaced apart in a third direction, also referred to herein as a thickness direction (e.g., the D3 direction) of the variable resistance memory device 100 and disposed on a lower electrode 125 and the substrate 102, respectively. The parallel side surfaces of the insulating pattern 112 may be spaced apart in a first direction (e.g., the D1 direction) and may each contact a side surface of an insulating pattern 110. A lower surface of the insulating pattern 112 may be coplanar with a lower surface of the first conductive line 110, and an upper surface of the insulating pattern 112 may be coplanar with an upper surface of the first conductive line 110. However, the present inventive concept is not limited thereto.

The first conductive line 110 may include W, WN, Au, Ag, Cu, Al, TiAlN, Ni, Co, Cr, Sn, Zn, ITO, and/or an alloy thereof. According to an exemplary embodiment of the present inventive concept, a barrier metal may surround a side surface and a bottom surface of the first conductive line 110. The second conductive line 180 may include the same material as that of the first conductive line 110. The insulating pattern 112 may include silicon oxide and/or silicon nitride.

The memory cell MC may be disposed at the intersection of the first conductive line 110 and the second conductive line 180 and may electrically connect the first conductive line 110 and the second conductive line 180. Further, the memory cell MC may have a stacked structure. According to an exemplary embodiment of the present inventive concept, the memory cell MC may include a lower electrode 125, a selection pattern 135, an intermediate electrode 145, a variable resistance pattern 155, and an upper electrode 165 which are sequentially stacked on the first conductive line 110. Alternatively, the selection pattern 135 may be disposed on the variable resistance pattern 155. For example, the lower electrode 125, the variable resistance pattern 155, the intermediate electrode 145, the selection pattern 135, and the upper electrode 165 may be sequentially stacked. According to an exemplary embodiment of the present inventive concept, the variable resistance pattern 155 may also be referred to hereafter as a variable resistor.

The lower electrode 125 may be disposed on the first conductive line 110. The lower electrode 125 may be electrically connected to the first conductive line 110. The lower electrode 125 may include a metal, such as W, Pt, Pd, Rh, Ru, Ir, Cu, Al, Ti, Ta, and/or a metal nitride, such as TiN. The upper electrode 165 may include a same material as the lower electrode 125.

The selection pattern 135 may be disposed between the lower electrode 125 and the upper electrode 165. According to an exemplary embodiment of the present inventive concept, the selection pattern 135 may be disposed adjacent to the lower electrode 125. The selection pattern 135 may be electrically connected to the lower electrode 125. The selection pattern 135 may control a current flow in the memory cell MC.

According to an exemplary embodiment of the present inventive concept, the selection pattern 135 may include a material having an ovonic threshold switching (OTS) characteristic. For example, the selection pattern 135 may include a chalcogenide material. The chalcogenide material may include a compound in which Te and/or Se, which are chalcogen elements, is combined with Ge, Sb, Bi, Al, Pb, Sn, Ag, As, S, Si, In, Ti, Ga, and/or P. According to an exemplary embodiment of the present inventive concept, the chalcogenide material may include AsTe, AsSe, GeTe, SnTe, GeSe, SnTe, SnSe, ZnTe, AsTeSe, AsTeGe, AsSeGe, AsTeGeSe, AsSeGeSi, AsTeGeSi, AsTeGeS, AsTeGeSiIn, AsTeGeSiP, AsTeGeSiSbS, AsTeGeSiSbP, AsTeGeSeSb, AsTeGeSeSi, SeTeGeSi, GeSbTeSe, GeBiTeSe, GeAsSbSe, GeAsBiTe and/or GeAsBiSe.

The intermediate electrode 145 may be disposed between the selection pattern 135 and the variable resistance pattern 155. According to an exemplary embodiment of the present inventive concept, the intermediate electrode 145 may be disposed on the selection pattern 135 and electrically coupled to the selection pattern 135 and the variable resistance pattern 155. The intermediate electrode 145 may be a heating electrode and may transfer heat to the variable resistance pattern 155. The intermediate electrode 145 may include a material having a resistance that is greater than a resistance of the lower electrode 125. According to an exemplary embodiment of the present inventive concept, the intermediate electrode 145 may include a metal nitride and/or a metal silicon nitride such as TiN, TiSiN, WN, WSiN, TaN, TaSiN, ZrN and/or ZrSiN.

The variable resistance pattern 155 may be disposed between the lower electrode 125 and the upper electrode 165. According to an exemplary embodiment of the present inventive concept, the variable resistance pattern 155 may be disposed adjacent to the upper electrode 165. The variable resistance pattern 155 may be electrically connected to the upper electrode 165. A resistance of the variable resistance pattern 155 may vary according to a change in a temperature of the variable resistance pattern 155.

The variable resistance pattern 155 may include a compound in which Te and/or Se is combined with Ge, Sb, Bi, Pb, Sn, Ag, As, S, Si, In, Ti, Ga, P, O and/or C. For example, the variable resistance pattern 155 may include GeSbTe, GeTeAs, SbTeSe, GeTe, SbTe, SeTeSn, GeTeSe, SbSeBi, GeBiTe, GeTeTi, InSe, GaTeSe and/or InSbTe.

A space between consecutive memory cells MC of a plurality of memory cells MC may be filled with the interlayer insulating layer ILD. The interlayer insulating layer ILD may be disposed on the first conductive line 110 and the insulating pattern 112. The interlayer insulating layer ILD may electrically insulate the plurality of memory cells MC from each other. According to an exemplary embodiment of the present inventive concept, the interlayer insulating layer ILD may include silicon oxide.

The anti-oxidation layer 170 may cover side surfaces of the memory cell MC. Further, the anti-oxidation layer 170 may cover a lower surface of the interlayer insulating layer ILD and a portion of an upper surface of each of the first conductive line 110 and the insulating pattern 112. For example, the anti-oxidation layer 170, the capping layer 175, and the interlayer insulating layer ILD may be sequentially stacked within the space provided between consecutive memory cells MC.

During a process of manufacturing the variable resistance memory device 100, the anti-oxidation layer 170 may prevent oxidation and moisture absorption of the memory cell MC. According to an exemplary embodiment of the present inventive concept, the anti-oxidation layer 170 may include Si and/or C. For example, the anti-oxidation layer 170 may include SiCxHy. According to an exemplary embodiment of the present inventive concept, a C content ratio of the anti-oxidation layer 170 may be 75 atomic percent or less. For example, the carbon content ratio of the anti-oxidation layer 170 may be in a range of 25 atomic percent to 75 atomic percent. A thickness of the anti-oxidation layer 170 may be in a range of 2 Å to 20 Å.

The capping layer 175 may be disposed on a surface of the anti-oxidation layer 170. According to an exemplary embodiment of the present inventive concept, the capping layer 175 may be disposed between the interlayer insulating layer ILD and the anti-oxidation layer 170. The capping layer 175 may electrically insulate the plurality of memory cells MC from each other. According to an exemplary embodiment of the present inventive concept, the capping layer 175 may include silicon nitride.

The second conductive line 180 may be disposed on the memory cell MC and may extend in the second direction (e.g., the D2 direction). The second conductive line 180 may be spaced apart from the first conductive line 110 in a thickness direction (e.g., the D3 direction). The plurality of second conductive lines 180 may be spaced apart from each other in the first direction (e.g., the D direction). The insulating layer 185 may be disposed on the interlayer insulating layer ILD and may extend in the second direction (e.g., the D2 direction). Further, the insulating layer 185 may be disposed between consecutive second conductive lines 180 of the plurality of second conductive lines 180 and may electrically insulate the plurality of second conductive lines 180 from each other. A lower surface of the insulating layer 185 may be coplanar with a lower surface of the second conductive line 180, and an upper surface of the insulating layer 185 may be coplanar with an upper surface of the second conductive line 180. The insulating layer 185 may include silicon oxide and/or silicon nitride.

FIGS. 3A to 3E are cross-sectional views illustrating a method of manufacturing the variable resistance memory device shown in FIG. 2.

Figure 3A:
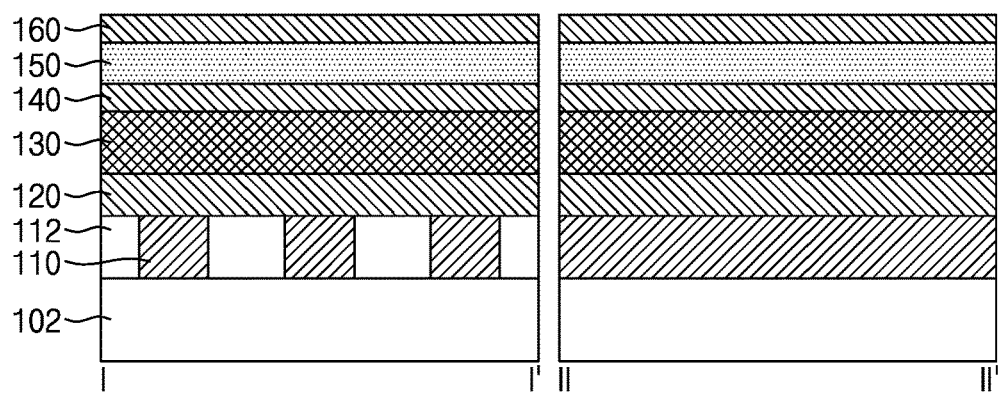
FIGS. 3A to 3E are cross-sectional views illustrating steps in a method of manufacturing the variable resistance memory device shown in FIG. 2.

Referring to FIG. 3A, the plurality of first conductive lines 110 may be disposed on the substrate 102. The insulating pattern 112 may be disposed between consecutive first conductive lines 110 of the plurality of first conductive lines 110. A stacked structure may be disposed on the first conductive line 110 and the insulating pattern 112. The stacked structure may be formed by disposing a lower electrode layer 120, a selection material layer 130, an intermediate electrode layer 140, a variable resistance layer 150, and an upper electrode layer 160 sequentially.

Figure 3B:
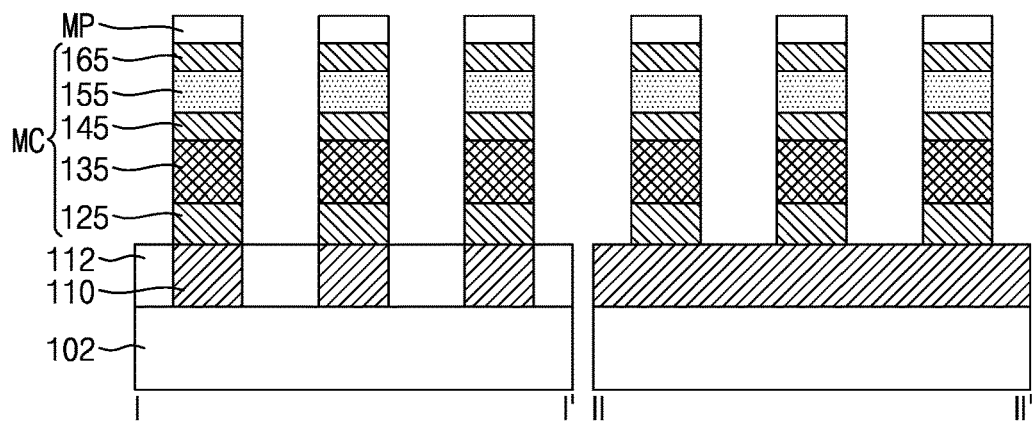

Referring to FIG. 3B, the stacked structure may be partially etched. According to an exemplary embodiment of the present inventive concept, the stacked structure may be etched in the first direction (e.g., the D1 direction) and the second direction (e.g., the D2 direction) to form the plurality of memory cells MC. For example, the stacked structure may be etched in the third direction (e.g., the D3 direction). The stacked structure may be etched using a mask pattern MP. The mask pattern MP may include silicon oxide and/or silicon nitride. The mask pattern MP may be a hard mask patterned through a photolithography process. The mask pattern MP may have the form of islands which are spaced apart from each other in the first direction (e.g., the D1 direction) and the second direction (e.g., the D2 direction). According to an exemplary embodiment of the present inventive concept, the stacked structure may be formed using a reactive ion etching (RIE) process.

The stacked structure may be etched such that the plurality of memory cells MC may be formed on the plurality of first conductive lines 110. Each of the memory cells MC may include the lower electrode 125, the selection pattern 135, the intermediate electrode 145, the variable resistance pattern 155, and the upper electrode 165 sequentially stacked. The plurality of memory cells MC may have island-shaped patterns which are spaced apart from each other in the first direction (e.g., the D1 direction) and the second direction (e.g., the D2 direction).

Figure 3C:
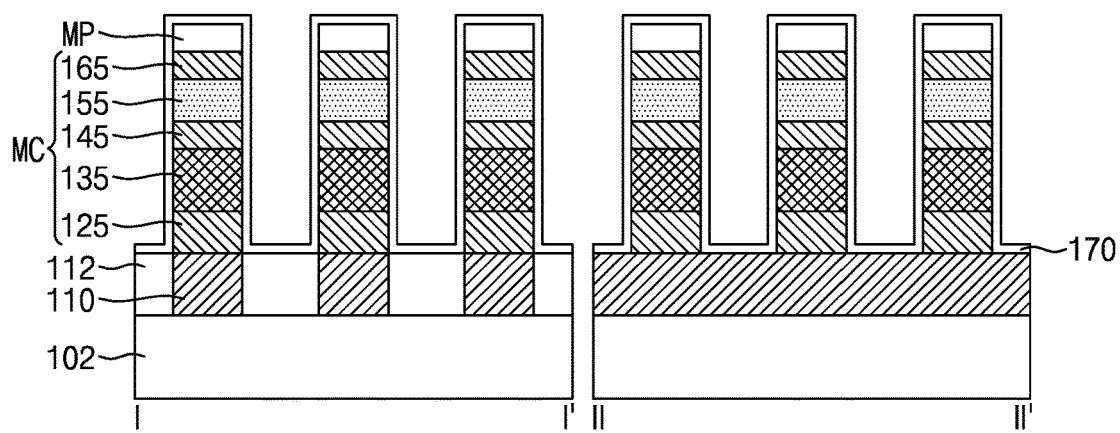

Referring to FIG. 3C, the anti-oxidation layer 170 may be formed on the resultant structure of FIG. 3B. According to an exemplary embodiment of the present inventive concept, the anti-oxidation layer 170 may cover surfaces of the first conductive line 110, the insulating pattern 112, the memory cell MC, and the mask pattern MP. According to an exemplary embodiment of the present inventive concept, the formation of the anti-oxidation layer 170 may be performed in-situ with the etching of the stacked structure.

The anti-oxidation layer 170 may include SiCxHy. For example, the anti-oxidation layer 170 may be formed through a process of chemical vapor deposition (CVD) or plasma enhanced CVD (PECVD). Tri-methyl silane (3MS) and/or tetra-methyl silane (4MS) may be used as a precursor in the deposition of the anti-oxidation layer 170. However, the present inventive concept is not limited thereto, and other material containing Si—CH3 may be used as the precursor. The deposition of the anti-oxidation layer 170 may be performed in a process chamber in a condition in which a temperature is in a range of 300° C. to 400° C. and a pressure is in a range of 1 Torr to 7 Torr. During the deposition of the anti-oxidation layer 170, an inert gas, such as He and/or Ar, may be provided as a carrier gas.

Figure 3D:
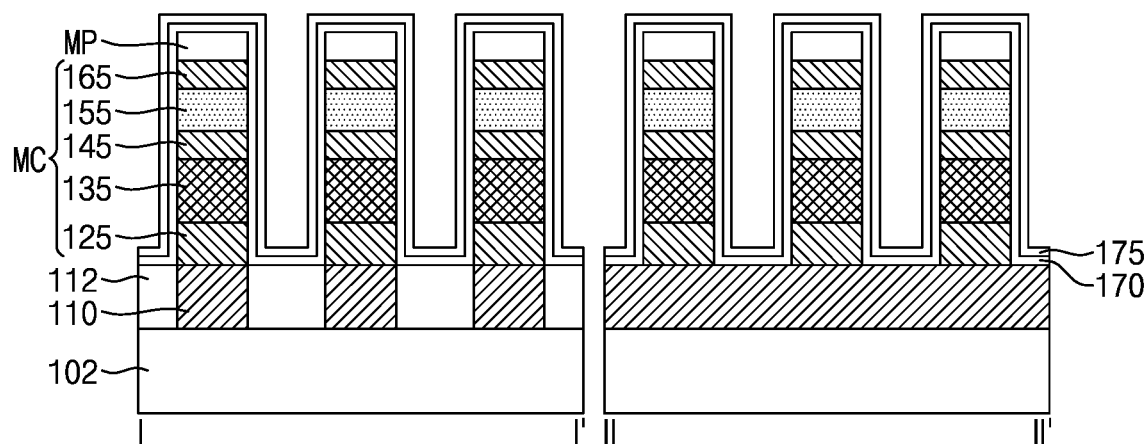

Referring to FIG. 3D, the capping layer 175 may be formed on the resultant structure of FIG. 3C. According to an exemplary embodiment of the present inventive concept, the capping layer 175 may cover a surface of the anti-oxidation layer 170. The capping layer 175 includes silicon nitride and may be formed through a method of atomic layer deposition (ALD), CVD, or the like. According to an exemplary embodiment of the present inventive concept, the capping layer 175 may be formed in a chamber different from a chamber in which the anti-oxidation layer 170 is formed. For example, the capping layer 175 may be formed ex-situ. However, the present inventive concept is not limited thereto.

Figure 3E:
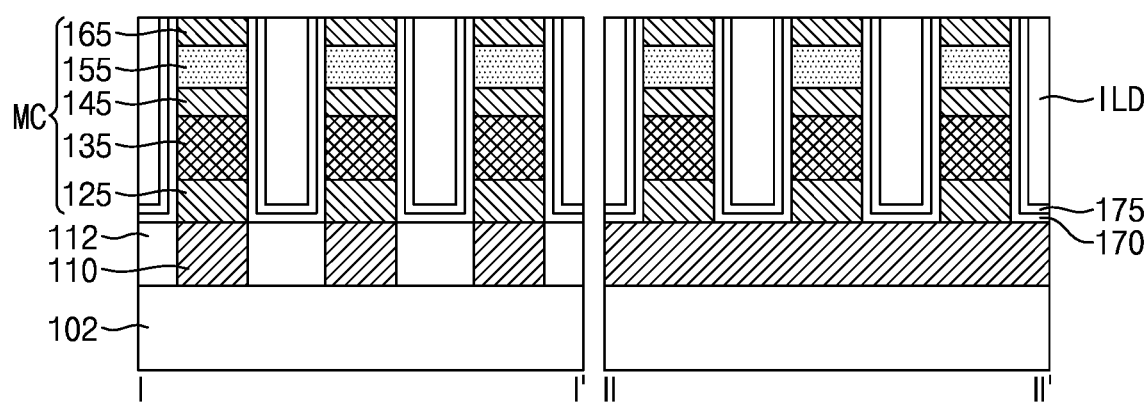

Referring to FIG. 3E, the interlayer insulating layer ILD may be formed on the resultant structure of FIG. 3D. The interlayer insulating layer ILD may be formed on the capping layer 175 and fill a space between the plurality of memory cells MC. According to an exemplary embodiment of the present inventive concept, the interlayer insulating layer ILD may cover the top of each of the memory cells MC and then planarized together with the mask pattern MP. An upper surface of the planarized interlayer insulating layer ILD may be coplanar with an upper surface of the upper electrode 165.

Referring again to FIG. 2, the plurality of second conductive lines 180 may be disposed on the resultant structure of FIG. 3E. The plurality of second conductive lines 180 may extend in the second direction (e.g., the D2 direction). The insulating layer 185 may be disposed between the plurality of second conductive lines 180 and may extend in the second direction (e.g., the D2 direction).

Figure 4:
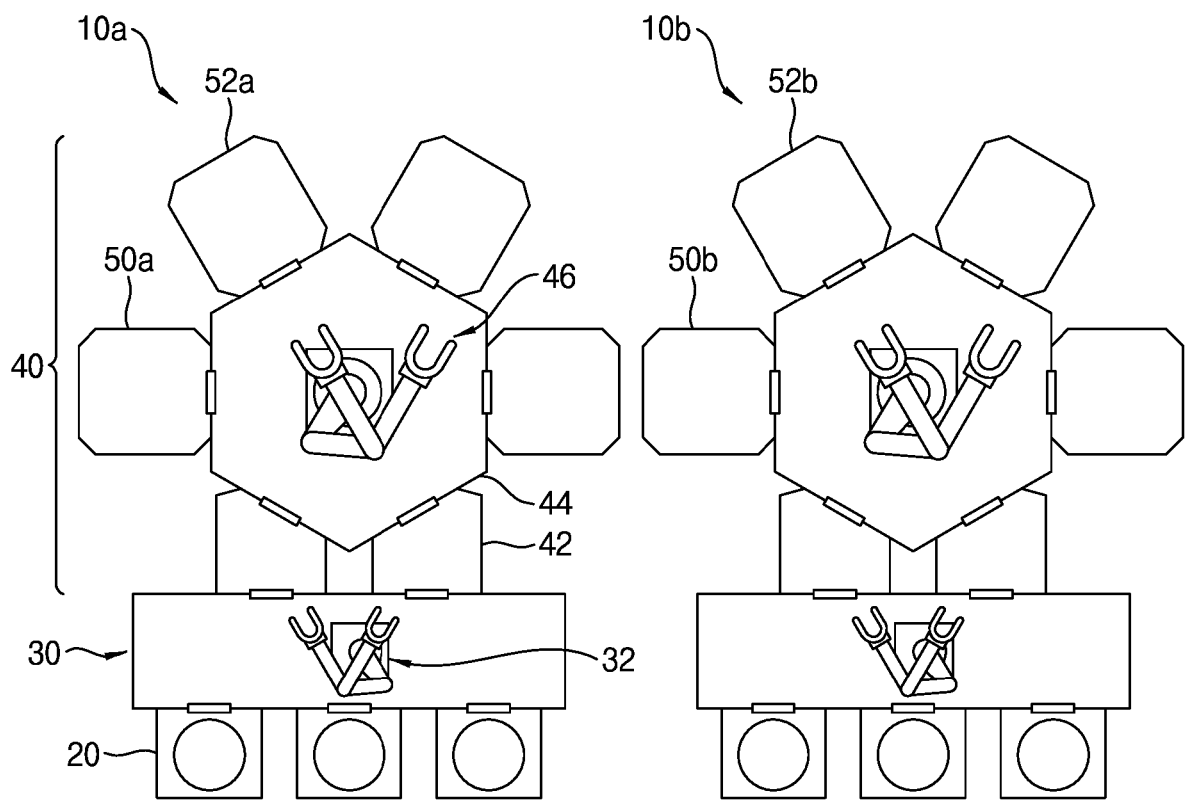
FIG. 4 is a plan view illustrating substrate processing apparatuses included in a method of manufacturing the anti-oxidation layer 170 according to the exemplary embodiment of the present inventive concept.

FIG. 4 is a plan view for describing a method of manufacturing the anti-oxidation layer 170 according to an exemplary embodiment of the present inventive concept.

Referring to FIG. 4, a first substrate processing apparatus 10a may include a load port 20, a transfer module 30, and a processing module 40. A wafer may be accommodated in the transfer module 30. The transfer module 30 may transfer the wafer between the load port 20 and the processing module 40. For example, the transfer module 30 may draw the wafer out from the load port 20 to transfer the wafer to the processing module 40 or draw the wafer out from the processing module 40 to transfer the wafer to the load port 20. The transfer module 30 may include a transfer robot 32 therein for transferring a wafer.

A process may be performed on the wafer in the processing module 40. The processing module 40 may include a load lock chamber 42, a transfer chamber 44, and a transfer robot 46. Further, a plurality of chambers may be connected to the transfer chamber 44. For example, a first process chamber 50a and a second process chamber 52a may be connected to the transfer chamber 44.

The load lock chamber 42 may be connected to the transfer module 30 and may transfer the wafer between the transfer module 30 and the transfer chamber 44. The transfer chamber 44 may include the transfer robot 46 therein. The transfer chamber 44 may transfer the wafer between the load lock chamber 42 and the first and second process chambers 50a and 52a. A process may be performed on the wafer in the first process chamber 50a and the second process chamber 52a. Although four process chambers have been illustrated as being connected to the transfer chamber 44 in FIG. 4, the present inventive concept is not limited thereto, and more or fewer process chambers may be connected to the transfer chamber 44.

A second substrate processing apparatus 10b may include a first process chamber 50b and a second process chamber 52b. The second substrate processing apparatus 10b may have a configuration identical or similar to that of the first substrate processing apparatus 10a, and a detailed description thereof will be omitted for brevity of description.

Hereinafter, a process of forming the anti-oxidation layer 170 using the first and second substrate processing apparatuses 10a and 10b of FIG. 4 will be described.

As shown in FIGS. 3B, 3D, and 3E, the method of manufacturing the variable resistance memory device 100 may include etching the stacked structure, depositing the capping layer 175, and depositing the interlayer insulating layer ILD. Further, as shown in FIG. 3C, the method of manufacturing the variable resistance memory device 100 may further include, before the deposition of the capping layer 175, depositing the anti-oxidation layer 170.

Referring to FIGS. 3B and 4, an etching process may be performed in the first substrate processing apparatus 10a. For example, the etching of the stacked structure may be performed in the first process chamber 50a. Further, deposition of a dielectric layer may be performed in the second substrate processing apparatus 10b. For example, the deposition of the capping layer 175 and the deposition of the interlayer insulating layer ILD may be performed in the first process chamber 50b.

The deposition of the anti-oxidation layer 170 may be performed in the first substrate processing apparatus 10a. According to an exemplary embodiment of the present inventive concept, the formation of the anti-oxidation layer 170 may be performed in-situ with the etching of the stacked structure. For example, the stacked structure is etched in the first process chamber 50a of the first substrate processing apparatus 10a and then the wafer is drawn to the transfer chamber 44. Thereafter, the wafer is transferred to the second process chamber 52a, and the deposition of the anti-oxidation layer 170 may be performed. Herein, in-situ may mean a process which is performed in the same processing module 40 while a vacuum state is continuously maintained therein.

As described above, the etching of the stacked structure and the formation of the anti-oxidation layer 170 are performed in-situ such that oxidation of the stacked structure may be prevented before the capping layer 175 is formed. Further, since the anti-oxidation layer 170 contains SiCxHy, it is possible to prevent the oxidation more efficiently.

Figure 5:
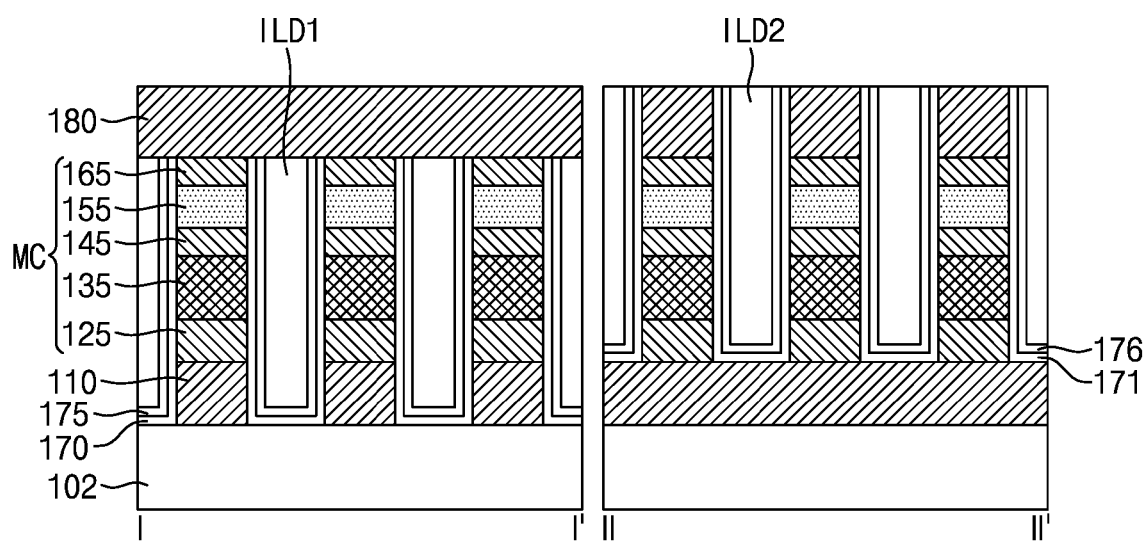
FIG. 5 is cross-sectional views illustrating a variable resistance memory device according to an exemplary embodiment of the present inventive concept.

FIG. 5 shows cross-sectional views of a variable resistance memory device according to an exemplary embodiment of the present inventive concept. FIGS. 6A to 6H are cross-sectional views, which are illustrated according to a process sequence, for describing a method of manufacturing the variable resistance memory device shown in FIG. 5. A detailed description of a configuration which is the same as that of the variable resistance memory device 100 shown in FIG. 2 will be omitted.

Referring to FIG. 5, a variable resistance memory device 100 according to the exemplary embodiment of the present inventive concept may include a first interlayer insulating layer ILD 1, a second interlayer insulating layer ILD 2, a first anti-oxidation layer 170, a second anti-oxidation layer 171, a first capping layer 175, and a second capping layer 176. The first interlayer insulating layer ILD1 may extend in the first direction (e.g., the D1 direction) and may be disposed between a plurality of memory cells MC. The second interlayer insulating layer ILD2 may extend in the second direction (e.g., the D2 direction) and may be disposed between the plurality of memory cells MC.

The first anti-oxidation layer 170 may cover the upper surface of the substrate 102, side surfaces of each of the memory cells MC, and side surfaces of the first conductive line 110. The second anti-oxidation layer 171 may cover an upper surface of the first conductive line 110, the side surfaces of each of the memory cells MC, and side surfaces of the second conductive line 180.

The first capping layer 175 may be disposed on the first anti-oxidation layer 170, and the second capping layer 176 may be disposed on the second anti-oxidation layer 171. The first anti-oxidation layer 170 and the first capping layer 175 may cover a lower portion of the first interlayer insulating layer ILD1. The second anti-oxidation layer 171 and the second capping layer 176 may cover a lower portion of the second interlayer insulating layer ILD2.

Hereinafter, the method of manufacturing the variable resistance memory device shown in FIG. 5 will be described according to a process sequence with reference to FIGS. 6A to 6H.

Figure 6A:
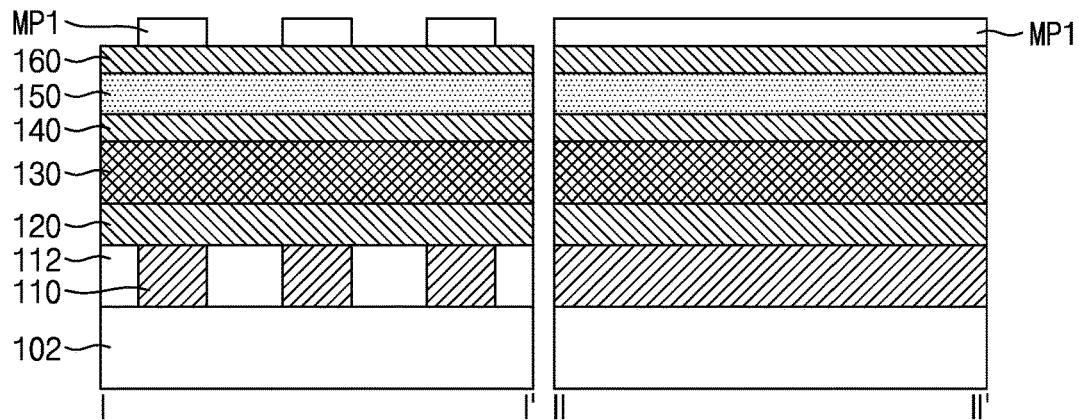
FIGS. 6A to 6H are cross-sectional views illustrating steps in a method of manufacturing the variable resistance memory device shown in FIG. 5.

Referring to FIG. 6A, the first conductive line 110 may be disposed on the substrate 102. A stacked structure may be disposed on the first conductive line 110. The stacked structure may include the lower electrode layer 120, the selection material layer 130, the intermediate electrode layer 140, the variable resistance layer 150, and the upper electrode layer 160. A mask pattern MP1 may be disposed on the upper electrode layer 160. The mask pattern MP1 may extend in the first direction (e.g., the D1 direction).

Figure 6B:
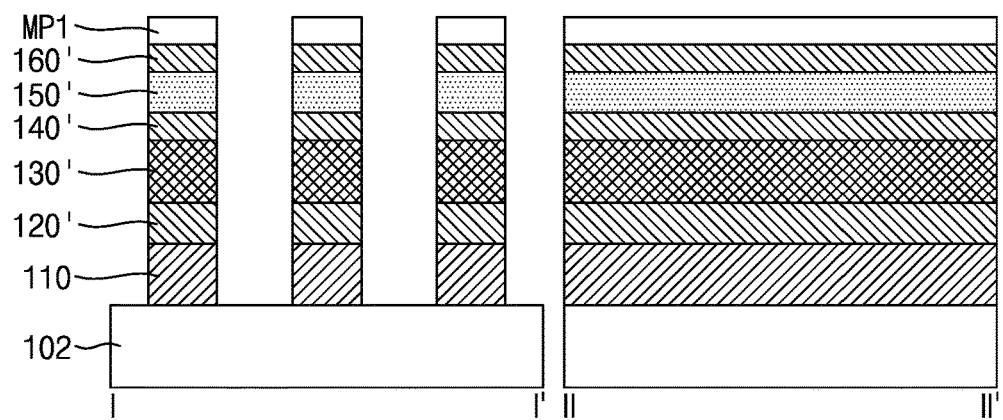

Referring to FIG. 6B, the stacked structure may be etched along the mask pattern MP1. For example, etching may be performed between consecutive island portions of the mask pattern MP1 in the third direction (e.g., the DR3 direction) including underlying portions of the insulating pattern 112, in contrast to the parallel step depicted in FIG. 3B of the manufacturing process of the variable resistance memory device 100 shown in FIG. 2. According to an exemplary embodiment of the present inventive concept, the stacked structure may be etched through an RIE process. A lower electrode layer 120', a selection material layer 130', an intermediate electrode layer 140', a variable resistance layer 150', and an upper electrode layer 160' of the etched stacked structure may each extend in the second direction (e.g., the D2 direction).

Figure 6C:
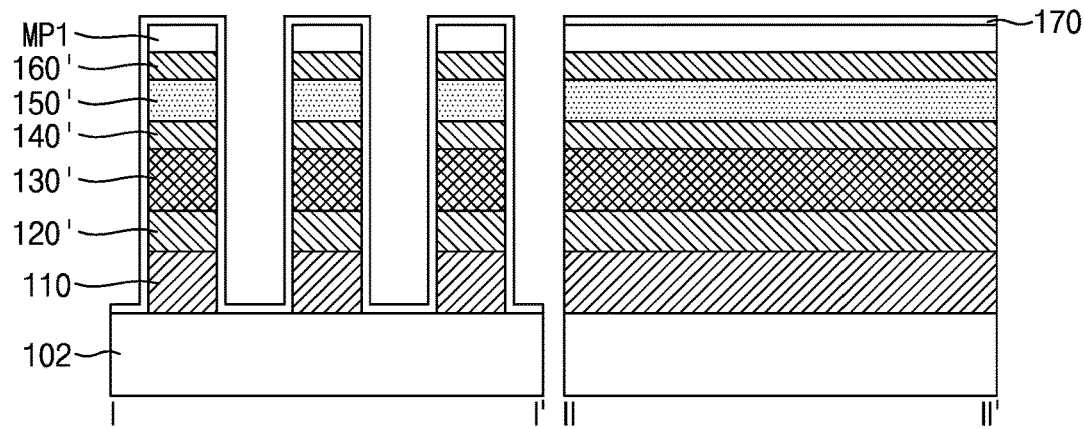
Figure 6D:
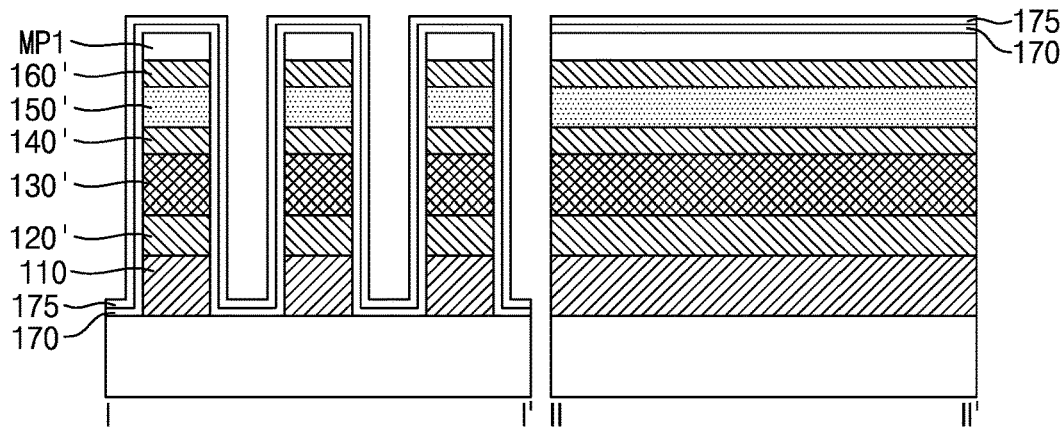

Referring to FIG. 6C, the first anti-oxidation layer 170 may be formed on the resultant structure of FIG. 6B. The first anti-oxidation layer 170 may cover the upper surface of the substrate 102 and side surfaces of the stacked structure. Referring to FIG. 6D, the capping layer 175 may be formed on the resultant structure of FIG. 6C. The first capping layer 175 may be disposed on the first anti-oxidation layer 170.

Figure 6E:
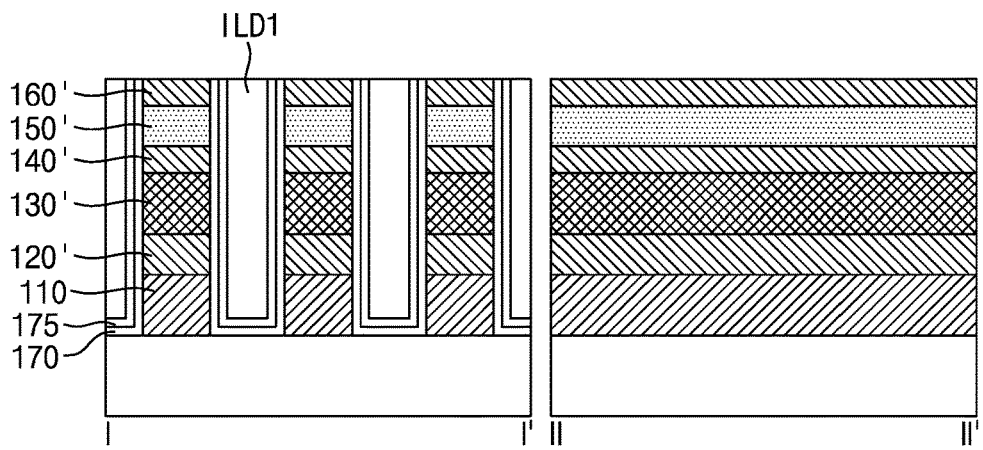
Figure 6F:
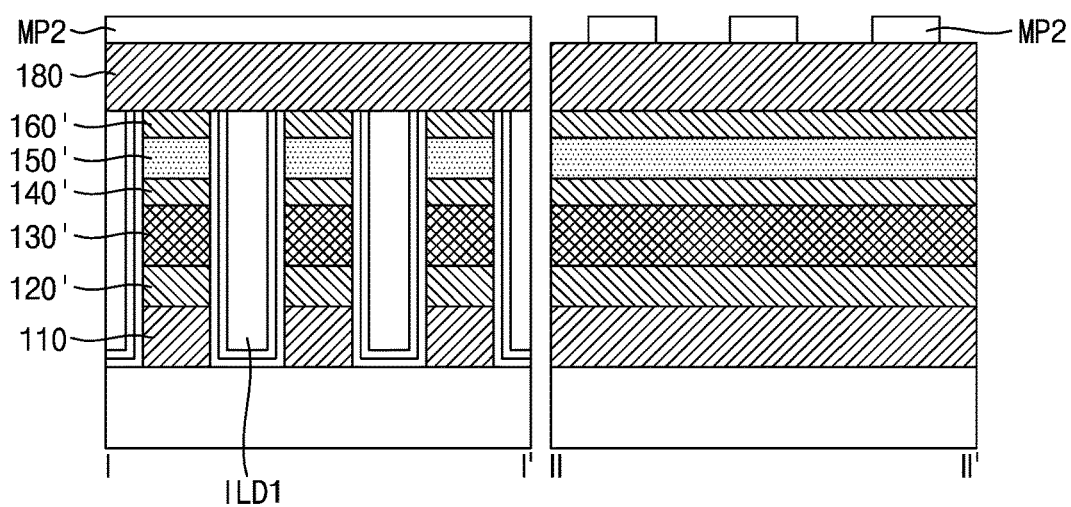

Referring to FIG. 6E, the first interlayer insulating layer ILD1 may be formed. A space between a plurality of memory cells MC may be filled with the first interlayer insulating layer ILD1. The first interlayer insulating layer ILD1 may extend in the first direction (e.g., the D1 direction). Referring to FIG. 6F, the second conductive line 180 and a mask pattern MP2 may be formed. The second conductive line 180 may be disposed on the stacked structure and the first interlayer insulating layer ILD1. The mask pattern MP2 may be disposed on the second conductive line 180 and may extend in the second direction (e.g., the D2 direction).

Figure 6G:
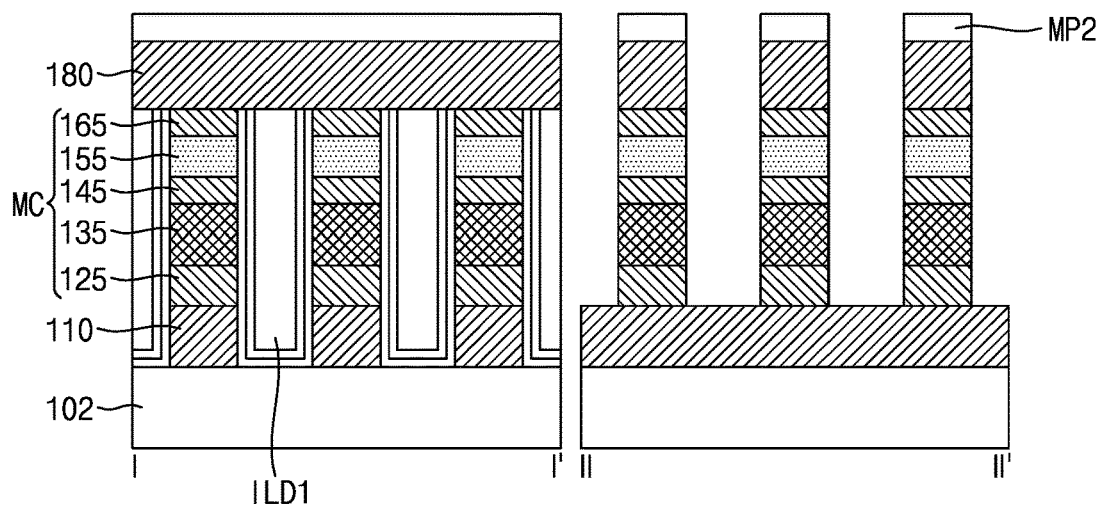

Referring to FIG. 6G, the second conductive line 180 and the stacked structure may be etched along the mask pattern MP2. According to an exemplary embodiment of the present inventive concept, the stacked structure is etched in the second direction (e.g., the D2 direction) such that the lower electrode 125, the selection pattern 135, the intermediate electrode 145, the variable resistance pattern 155, and the upper electrode 165 may be formed. The lower electrode 125, the selection pattern 135, the intermediate electrode 145, the variable resistance pattern 155, and the upper electrode 165 constitute each of the plurality of memory cells MC. The plurality of memory cells MC may be disposed in the form of islands which are spaced apart from each other in the first direction (e.g., the D1 direction) and the second direction (e.g., the D2 direction). The etched second conductive line 180 may have a form extending in the second direction (e.g., the D2 direction).

Figure 6H:
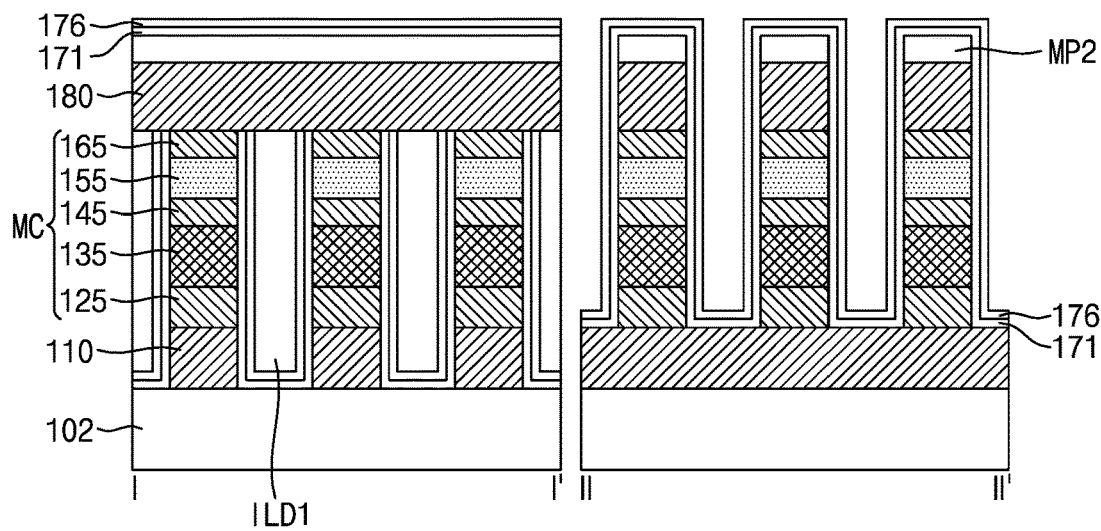

Referring to FIG. 6H, the second anti-oxidation layer 171 and the second capping layer 176 may be sequentially formed on the resultant structure of FIG. 6G. The second anti-oxidation layer 171 may cover an upper surface of the first conductive line 110, the side surfaces of each of the memory cells MC, and side surfaces of the second conductive line 180. The second capping layer 176 may be disposed along a surface of the second anti-oxidation layer 171. The second anti-oxidation layer 171 and the second capping layer 176 may include the same material as those of the first anti-oxidation layer 170 and the first capping layer 175, respectively.

Referring again to FIG. 5, the second interlayer insulating layer ILD2 may be formed between the plurality of memory cells MC. According to an exemplary embodiment of the present inventive concept, the second interlayer insulating layer ILD2 may be formed through a planarization process after an insulating material is formed between the plurality of memory cells MC. The second anti-oxidation layer 171, a portion of the second capping layer 176, and the mask pattern MP2 may also be removed. The second interlayer insulating layer ILD2 may extend in the second direction (e.g., the D2 direction). The second interlayer insulating layer ILD2 may include the same material as that of the first interlayer insulating layer ILD1.

As shown in FIGS. 6A to 6H, the stacked structure including the lower electrode layer 120, the selection material layer 130, the intermediate electrode layer 140, the variable resistance layer 150, and the upper electrode layer 160 may be patterned twice. The first interlayer insulating layer ILD1 and the second interlayer insulating layer ILD2 may be formed in different operations. Further, as shown in FIG. 5, the second anti-oxidation layer 171 and the second capping layer 176 may cover the second conductive line 180.

Figure 7:
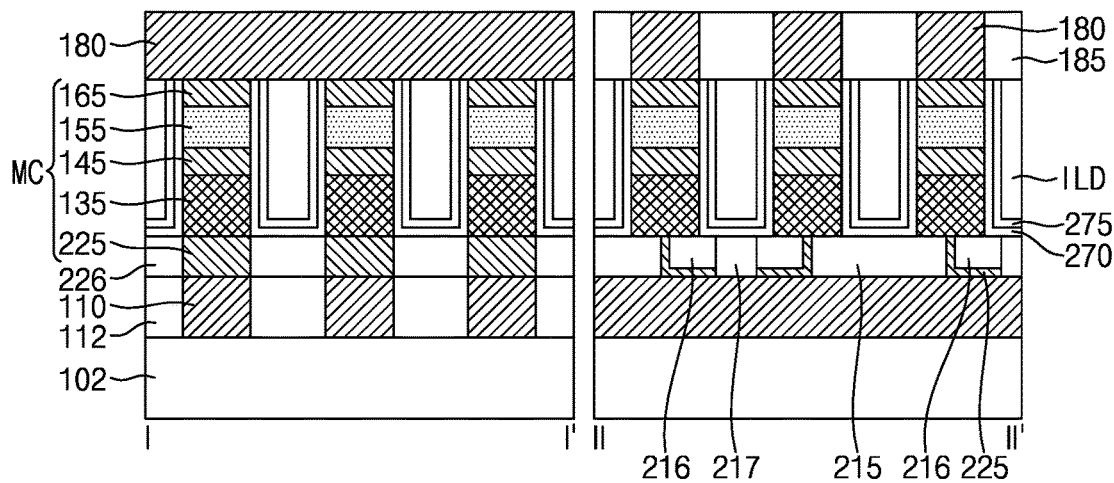
FIG. 7 is cross-sectional views illustrating a variable resistance memory device according to an exemplary embodiment of the present inventive concept.

FIG. 7 shows cross-sectional views of a variable resistance memory device according to an exemplary embodiment of the present inventive concept. FIGS. 8A to 8H are cross-sectional views, which are illustrated according to a process sequence, for describing a method of manufacturing the variable resistance memory device shown in FIG. 7.

Referring to FIG. 7, a variable resistance memory device 100 according to the exemplary embodiment of the present inventive concept may include memory cells MC, an anti-oxidation layer 270, and a capping layer 275. The memory cell MC may include a lower electrode 225, the selection pattern 135, the intermediate electrode 145, the variable resistance pattern 155, and the upper electrode 165.

In the variable resistance memory device 100 according to the exemplary embodiment of the present inventive concept, a width of the lower electrode 225 may be smaller than a width of the selection pattern 135. For example, when viewed from the cross-sectional view taken along line I-I', the width of the lower electrode 225 may be substantially equal to a width of the memory cell MC. When viewed from the cross-sectional view taken along line II-II', the lower electrode 225 may have a bent shape. For example, the lower electrode 225 may have a bent pattern shape including a vertical portion extending in the thickness direction (e.g., the D3 direction) and a horizontal portion extending in the first direction (e.g., the D1 direction). The vertical portion may be in contact with the selection pattern 135, and the horizontal portion may be connected to the first conductive line 110. As shown in FIG. 7, since an area of the vertical portion of the lower electrode 225 in contact with the selection pattern 135 is small, power consumption may be reduced.

The variable resistance memory device 100 may further include a lower insulating layer 215, a lower spacer 216, and a buried insulating layer 217 each including upper surfaces and lower surfaces which are coplanar with an upper surface and a lower surface of the lower electrode 225. The lower insulating layer 215 may be disposed on a side surface of the lower electrode 225 (e.g., overlapping the vertical portion of the lower electrode 225), and the lower spacer 216 may cover the lower electrode 225. For example, the lower spacer 216 may have a substantially rectangular shape corresponding to a shape defined between the vertical portion and the horizontal portion of the lower electrode 225. The buried insulating layer 217 may be disposed between at least two adjacent lower spacers 216. The buried insulating layer 217 may have a substantially similar width in the first direction (e.g., the DR1 direction) to a width of the interlayer insulating layer ILD in the first direction (e.g., the DR1 direction), and may overlap the interlayer insulating layer ILD, the capping layer 275 and the anti-oxidation layer 270 in a thickness direction (e.g., the DR3 direction). According to an exemplary embodiment of the present inventive concept, the lower insulating layer 215 and the buried insulating layer 217 may each include silicon oxide. According to an exemplary embodiment of the present inventive concept, the lower spacer 216 may include silicon nitride and/or silicon oxynitride. The anti-oxidation layer 270 may cover an upper surface of the lower insulating layer 215 and side surfaces of the memory cell MC. The capping layer 275 may be disposed along a surface of the anti-oxidation layer 270.

Hereinafter, the method of manufacturing the variable resistance memory device shown in FIG. 7 will be described according to a process sequence with reference to FIGS. 8A to 8H.

Figure 8A:
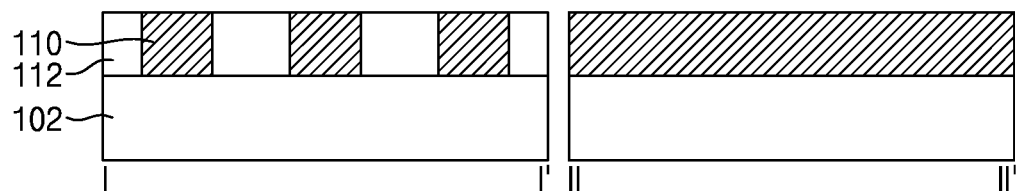
FIGS. 8A to 8H are cross-sectional views illustrating steps in a method of manufacturing the variable resistance memory device shown in FIG. 7.

Referring to FIG. 8A, the plurality of first conductive lines 110 may be disposed on the substrate 102. The insulating pattern 112 may be disposed between the plurality of first conductive lines 110. The first conductive line 110 may extend in the first direction (e.g., the D1 direction).

Figure 8B:
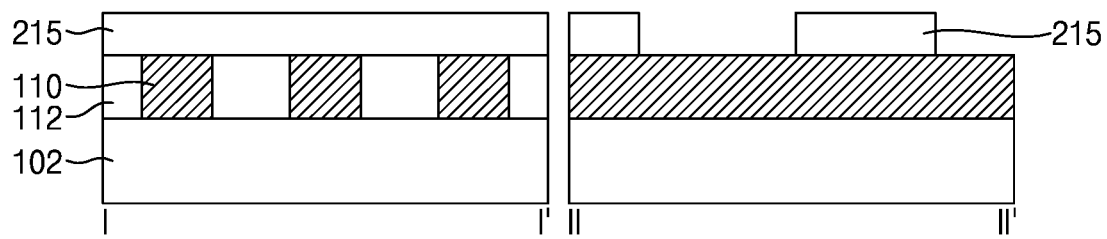

Referring to FIG. 8B, the lower insulating layer 215 may be disposed on the first conductive line 110. The lower insulating layer 215 may have a predetermined pattern extending in the second direction (e.g., the D2 direction). The lower insulating layer 215 may extend in the second direction (e.g., the D2 direction).

Figure 8C:
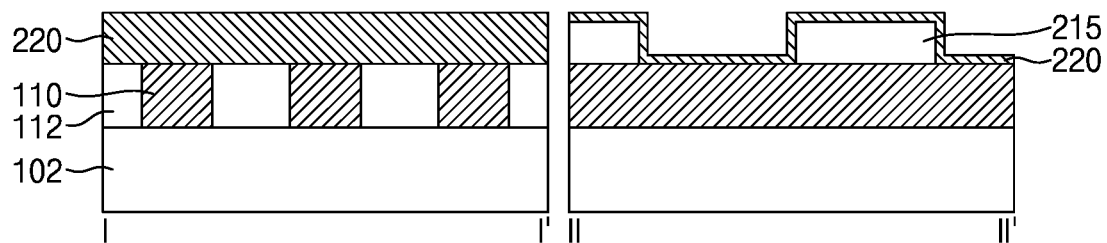

Referring to FIG. 8C, a lower electrode layer 220 may be formed on the lower insulating layer 215 and the first conductive line 110. The lower electrode layer 220 may be in contact with the first conductive line 110.

Figure 8D:
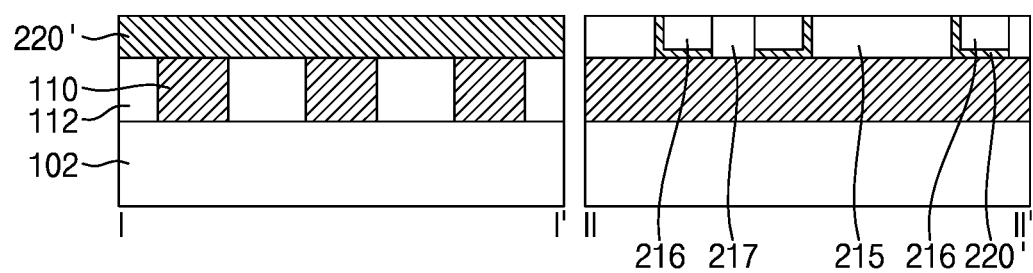

Referring to FIG. 8D, a portion of the lower electrode layer 220 may be removed. For example, the bent portions of the lower electrode layer 220 may be formed during the removal process by removal of the upper surface and portion of the first electrode layer 220 in contact with the first conductive lines 110. According to an exemplary embodiment of the present inventive concept, the lower electrode layer 220 on the lower insulating layer 215 may be removed through an anisotropic etching process to form a lower electrode layer 220' extending in the second direction (e.g., the D2 direction). The lower electrode layer 220' formed by the etching may have a bent pattern with a vertical portion and a horizontal portion. The horizontal portion may be in contact with the first conductive line 110. After the etching, the lower spacer 216 and the buried insulating layer 217 may be formed. The lower spacer 216 may be disposed on the lower electrode layer 220' having a bent shape. A space between the lower spacers 216 may be filled with the buried insulating layer 217. After the lower spacer 216 and the buried insulating layer 217 are formed, a planarization process may be performed. Upper surfaces of the lower spacer 216 and the buried insulating layer 217 may be coplanar with the upper surface of the lower insulating layer 215.

Figure 8E:
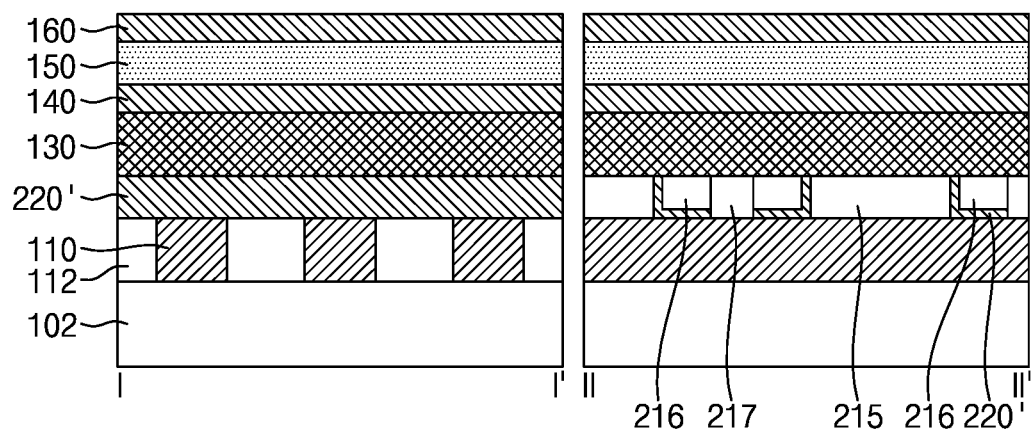

Referring to FIG. 8E, a stacked structure may be formed on the resultant structure of FIG. 8D. The stacked structure may include the selection material layer 130, the intermediate electrode layer 140, the variable resistance layer 150, and the upper electrode layer 160 which are sequentially stacked.

Figure 8F:
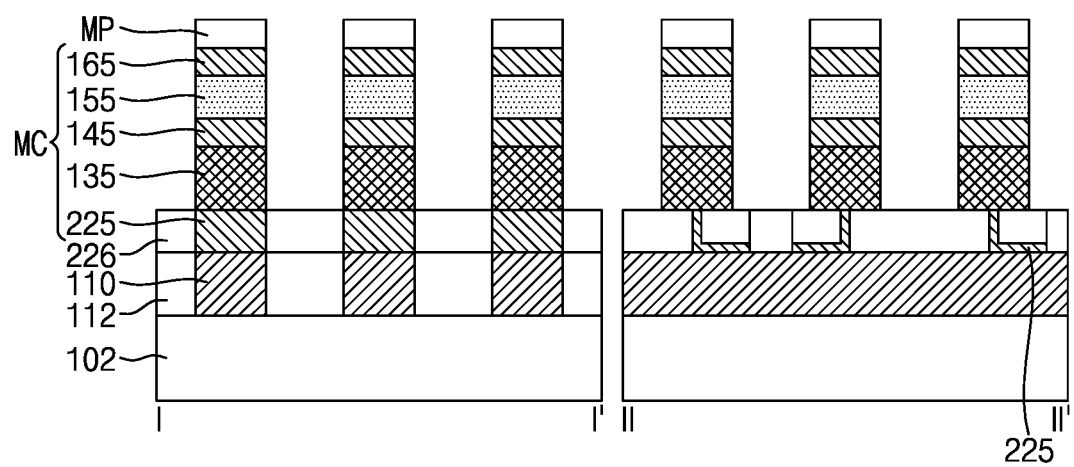

Referring to FIG. 8F, etching may be performed on the stacked structure. According to an exemplary embodiment of the present inventive concept, the stacked structure may be etched using the mask pattern MP in the first direction (e.g., the D1 direction) and the second direction (e.g., the D2 direction). The stacked structure is etched so that the memory cell MC including the lower electrode 225, the selection pattern 135, the intermediate electrode 145, the variable resistance pattern 155, and the upper electrode 165 may be formed. After the memory cell MC is formed, an insulating layer 226 may be formed. The insulating layer 226 may cover side surfaces of the lower electrode 225. According to an exemplary embodiment of the present inventive concept, an upper surface of the insulating layer 226 may be coplanar with the upper surface of the lower electrode 225.

Figure 8G:
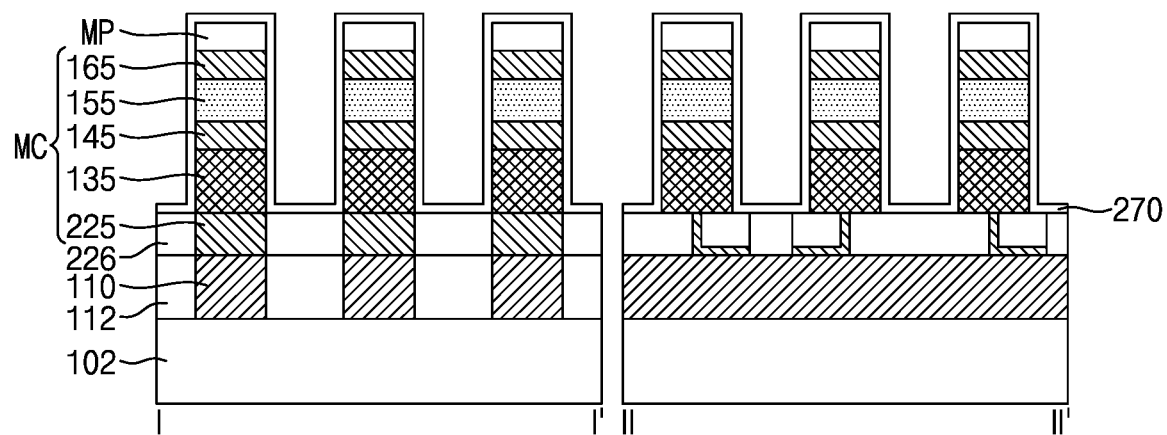
Figure 8H:
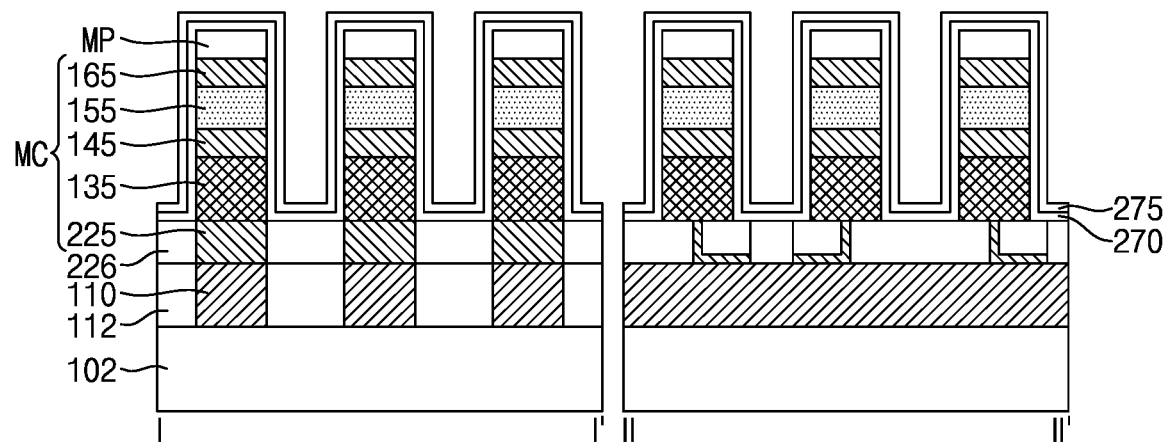

Referring to FIG. 8G, the anti-oxidation layer 270 may be formed on the resultant structure of FIG. 8F. The anti-oxidation layer 270 may cover the upper surfaces of the insulating layer 226 and the memory cell MC. Referring to FIG. 8H, the capping layer 275 may be formed on the resultant structure of FIG. 8G. The capping layer 275 may be disposed on the anti-oxidation layer 270.

Referring again to FIG. 7, the interlayer insulating layer ILD may be formed between the plurality of memory cells MC. Upper surfaces of the interlayer insulating layer ILD the mask pattern MP, the anti-oxidation layer 270, and the capping layer 275 may be removed through a planarization process. An upper surface of the interlayer insulating layer ILD may be coplanar with an upper surface of the upper electrode 165. The second conductive line 180 may be disposed on the interlayer insulating layer ILD and the upper electrode 165. The second conductive line 180 may extend in the second direction (e.g., the D2 direction). The insulating layer 185 may be disposed between a plurality of second conductive lines 180.

Figure 9:
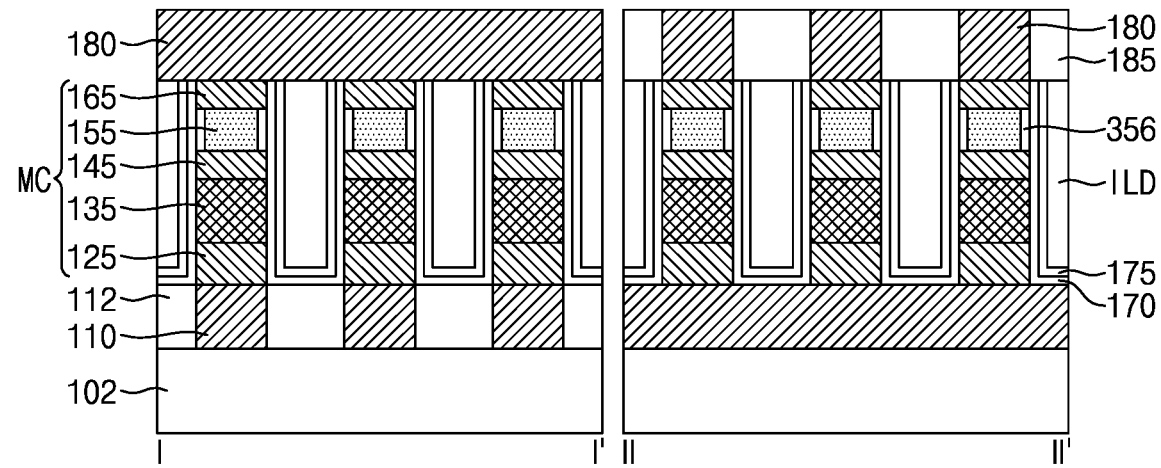
FIG. 9 is cross-sectional views illustrating a variable resistance memory device according to an exemplary embodiment of the present inventive concept.

FIG. 9 shows cross-sectional views of a variable resistance memory device according to an exemplary embodiment of the present inventive concept.

Referring to FIG. 9, a variable resistance memory device 100 may include a variable resistance pattern 155 and a side spacer 356. A width of the variable resistance pattern 155 may be less than that of an intermediate electrode 145 and may also be less than a width of an upper electrode 165. The side spacer 356 may be disposed outside the variable resistance pattern 155 to surround the variable resistance pattern 155. The side spacer 356 may include silicon nitride and/or silicon oxynitride. An anti-oxidation layer 170 may be disposed outside a memory cell MC. A second conductive line 180 may include a material which is the same as that of a first conductive line 110. As shown in FIG. 9, since the width of the variable resistance pattern 155 is small, heat transfer efficiency from the intermediate electrode 145 to the variable resistance pattern 155 may be increased.

Figure 10:
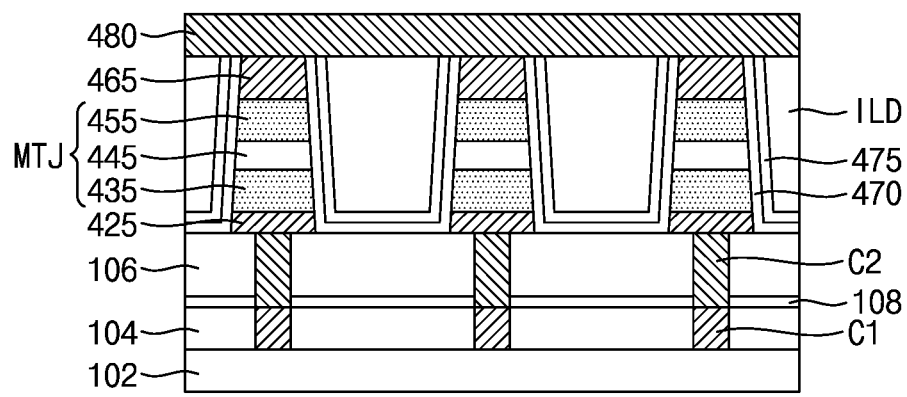
FIG. 10 is a cross-sectional view illustrating a variable resistance memory device according to an exemplary embodiment of the present inventive concept.

FIG. 10 is a cross-sectional view of a variable resistance memory device according to an exemplary embodiment of the present inventive concept.

Referring to FIG. 10, a variable resistance memory device 100 according to the exemplary embodiment of the present inventive concept may include a substrate 102, a lower electrode 425, a magnetic tunnel junction (MTJ) pattern, and an upper electrode 465. The MTJ pattern may have a tapered shape in the thickness direction (e.g., the DR3 direction). The variable resistance memory device 100 may further include an anti-oxidation layer 470, a capping layer 475, and a conductive line 480. The variable resistance memory device 100 may further include the conductive line 480 disposed on the upper electrode 465. The variable resistance memory device 100 may be a magnetoresistive random access memory (MRAM).

The substrate 102 may include a semiconductor substrate such as a silicon substrate, a germanium substrate, a silicon-germanium substrate, an SOI substrate, or the like. A first insulating pattern 104 and a second insulating pattern 106 may be sequentially stacked on the substrate 102. An etching stop film 108 may be disposed between the first insulating pattern 104 and the second insulating pattern 106. The first insulating pattern 104 and the second insulating pattern 106 may each include silicon oxide and/or a low-k dielectric material. The etching stop film 108 may include a material having an etch selectivity with respect to the insulating pattern 104 and the insulating pattern 106. According to an exemplary embodiment of the present inventive concept, the etching stop film 108 may include silicon nitride, silicon oxynitride, silicon carbonitride and/or silicon oxycarbonitride.

The first insulating pattern 104 may include a plurality of contacts C1 passing therethrough. Further, the second insulating pattern 106 may include a plurality of contacts C2 passing therethrough. One side of the contact C1 may be electrically connected to the contact C2. The other side of the contact C1 may be connected to a selection element disposed on the substrate 102. According to an exemplary embodiment of the present inventive concept, the selection element may be a transistor. The contact C2 may be electrically connected to the lower electrode 425. The contact C1 and the contact C2 may each include a metal such as W, Ti, and/or Ta, a metal nitride such as WN, TiN, and/or TaN, and/or a doped polysilicon. According to an exemplary embodiment of the present inventive concept, an upper surface of the insulating pattern 106 may be disposed at a level that is lower than that of a lower surface of the lower electrode 425. For example, a recess may be included in an upper portion of the insulating pattern 106.

A plurality of lower electrodes 425 may be spaced apart from each other. The lower electrode 425 may be electrically connected to the MTJ pattern. According to an exemplary embodiment of the present inventive concept, the lower electrode 425 may include TiN and/or TaN.

The MTJ pattern may be disposed on the lower electrode 425. The MTJ pattern may include a first magnetic pattern 435, a tunnel barrier pattern 445, and a second magnetic pattern 455 which are sequentially stacked. According to an exemplary embodiment of the present inventive concept, the first magnetic pattern 435 may be a fixed pattern in which a magnetization direction is fixed, and the second magnetic pattern 455 may be a free pattern in which a magnetization direction is variable. Alternatively, the first magnetic pattern 435 may be a free pattern and the second magnetic pattern 455 may be a fixed pattern. Resistance of the MTJ pattern may be varied according to the magnetization directions of the first magnetic pattern 435 and the second magnetic pattern 455. For example, the resistance of the MTJ pattern may become large when the magnetization directions of the first magnetic pattern 435 and the second magnetic pattern 455 are opposite to each other rather than when the magnetization directions thereof coincide with each other. The tunnel barrier pattern 445 may be disposed between the first magnetic pattern 435 and the second magnetic pattern 455. The magnetization directions of the first magnetic pattern 435 and the second magnetic pattern 455 may be parallel to the tunnel barrier pattern 445. Alternatively, the magnetization directions of the first magnetic pattern 435 and the second magnetic pattern 455 may be perpendicular to the tunnel barrier pattern 445. In the present inventive concept, the MTJ pattern may be referred to as a variable resistor.

According to an exemplary embodiment of the present inventive concept, the first magnetic pattern 435 may be a fixed pattern and include a layer containing an antiferromagnetic material and a layer containing a ferromagnetic material. The layer containing an antiferromagnetic material may include PtMn, IrMn, MnO, MnS, MnTe, MnF2, FeCl2, FeO, CoCl2, CoO, NiCl2, NiO, and/or Cr. The layer containing a ferromagnetic material may include CoFeB, Fe, Co, Ni, Gd, Dy, CoFe, NiFe, MnAs, MnBi, MnSb, CrO2, MnOFe2O3, FeOFe2O3, NiOFe2O3, CuOFe2O3, MgOFe2O3, EuO, and/or Y3Fe5O12. The second magnetic pattern 455 may be a free pattern and include a ferromagnetic material. The second magnetic pattern 455 may include FeB, Fe, Co, Ni, Gd, Dy, CoFe, NiFe, MnAs, MnBi, MnSb, CrO2, MnOFe2O3, FeOFe2O3, NiOFe2O3, CuOFe2O3, MgOFe2O3, EuO, and/or Y3Fe5O12. The tunnel barrier pattern 445 may include a metal oxide, such as MgO, RuO, VO, WO, VdO, TaO, HfO and/or MoO.

The upper electrode 465 may be disposed on the MTJ pattern. The upper electrode 465 may electrically connect the MTJ pattern to the conductive line 480. The upper electrode 465 may include the same material as that of the lower electrode 425.

The anti-oxidation layer 470 may cover an upper surface of the second insulating pattern 106, side surfaces of the MTJ pattern, and side surfaces of the upper electrode 465. The capping layer 475 may be disposed on a surface of the anti-oxidation layer 470. A space between a plurality of MTJ patterns may be filled with the interlayer insulating layer ILD. The conductive line 480 may be disposed on the upper electrode 465 and the interlayer insulating layer ILD. According to an exemplary embodiment of the present inventive concept, the conductive line 480 may be a bit line. The interlayer insulating layer ILD may include silicon oxide, silicon nitride and/or silicon oxynitride.

FIGS. 11A to 11D are cross-sectional views, which are illustrated according to a process sequence, for describing a method of manufacturing the variable resistance memory device shown in FIG. 10.

Figure 11A:
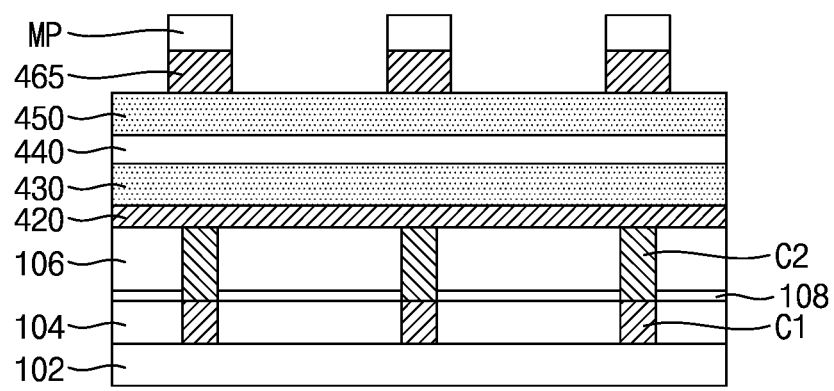
FIGS. 11A to 11D are cross-sectional views illustrating steps in a method of manufacturing the variable resistance memory device shown in FIG. 10.

Referring to FIG. 11A, the first insulating pattern 104, the second insulating pattern 106, a lower electrode layer 425, and an MTJ, which are sequentially stacked, may be disposed on the substrate 102. The MTJ layer may include a first magnetic pattern 435, a tunnel barrier pattern 445, and a second magnetic layer 455 which are sequentially stacked. The upper electrode 465 and the mask pattern MP may be disposed on the second magnetic layer 455.

Figure 11B:
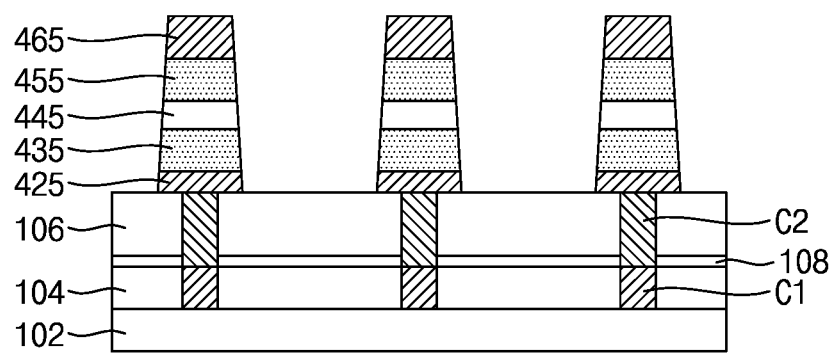

Referring to FIG. 11B, the MTJ pattern may be formed by etching the MTJ layer. An etching process may be performed on the MTJ layer by using the mask pattern MP as an etch mask. According to an exemplary embodiment of the present inventive concept, the MTJ layer may be etched through an ion beam etching process. A horizontal width of the MTJ pattern may become wider downward (e.g., in the DR3 direction towards the substrate 102). The MTJ pattern may include the first magnetic pattern 435, the tunnel barrier pattern 445, and the second magnetic pattern 455 which are sequentially stacked. According to an exemplary embodiment of the present inventive concept, the upper portion of the insulating pattern 106 may be partially removed through the etching process. For example, a recess may be formed on the insulating pattern 106.

Figure 11C:
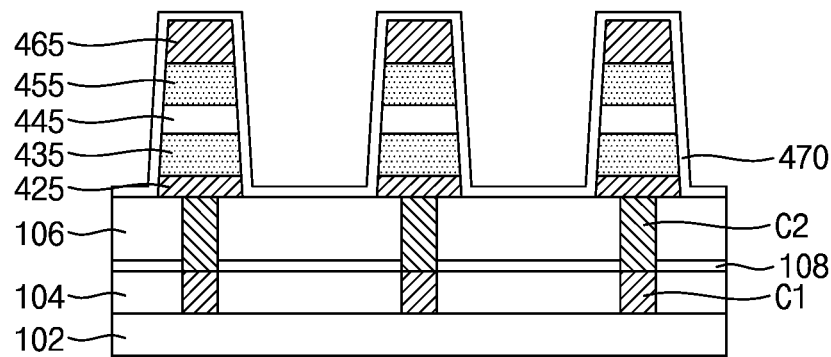

Referring to FIG. 11C, the anti-oxidation layer 470 may be formed on the resultant structure of FIG. 11B. According to an exemplary embodiment of the present inventive concept, the anti-oxidation layer 470 may cover the side surfaces of the MTJ pattern. Further, the anti-oxidation layer 470 may cover the upper surface of the insulating pattern 106.

Figure 11D:
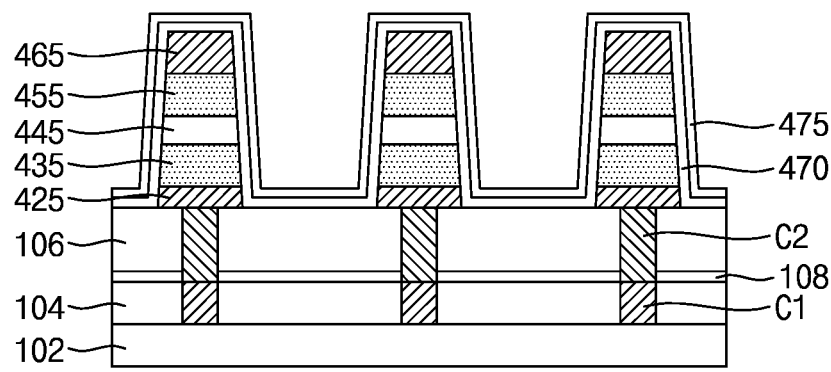

Referring to FIG. 11D, the capping layer 475 may be formed on the resultant structure of FIG. 1C. The capping layer 475 may be disposed on a surface of the anti-oxidation layer 470.

Referring again to FIG. 10, the interlayer insulating layer ILD may be formed between the MTJ patterns. Thereafter, the interlayer insulating layer ILD may be partially removed through a planarization process together with the anti-oxidation layer 470 and the capping layer 475. The conductive line 480 may be disposed on the planarized interlayer insulating layer ILD and the MTJ pattern. The conductive line 480 may be in contact with the upper electrode 465.

Figure 12:
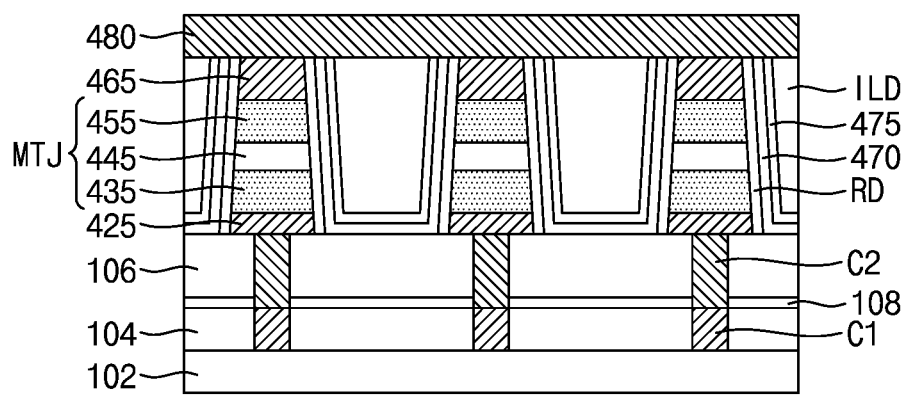
FIG. 12 is a cross-sectional view illustrating a variable resistance memory device according to an exemplary embodiment of the present inventive concept.

FIG. 12 is a cross-sectional view of a variable resistance memory device according to an exemplary embodiment of the present inventive concept.

Referring to FIG. 12, the variable resistance memory device may further include a redeposition film RD. According to an exemplary embodiment of the present inventive concept, the redeposition film RD may be disposed on a side surface of an MTJ pattern. An anti-oxidation layer 470 may be disposed on an upper surface of a second insulating pattern 106 and a surface of the redeposition film RD. Referring to FIG. 11B, during the etching of the MTJ layer, the second insulating pattern 106 may be partially etched, and the residue separated from the second insulating pattern 106 may be redeposited on a surface of the MTJ layer. The redeposition film RD may include the same material as that of the second insulating pattern 106.

Figure 13:
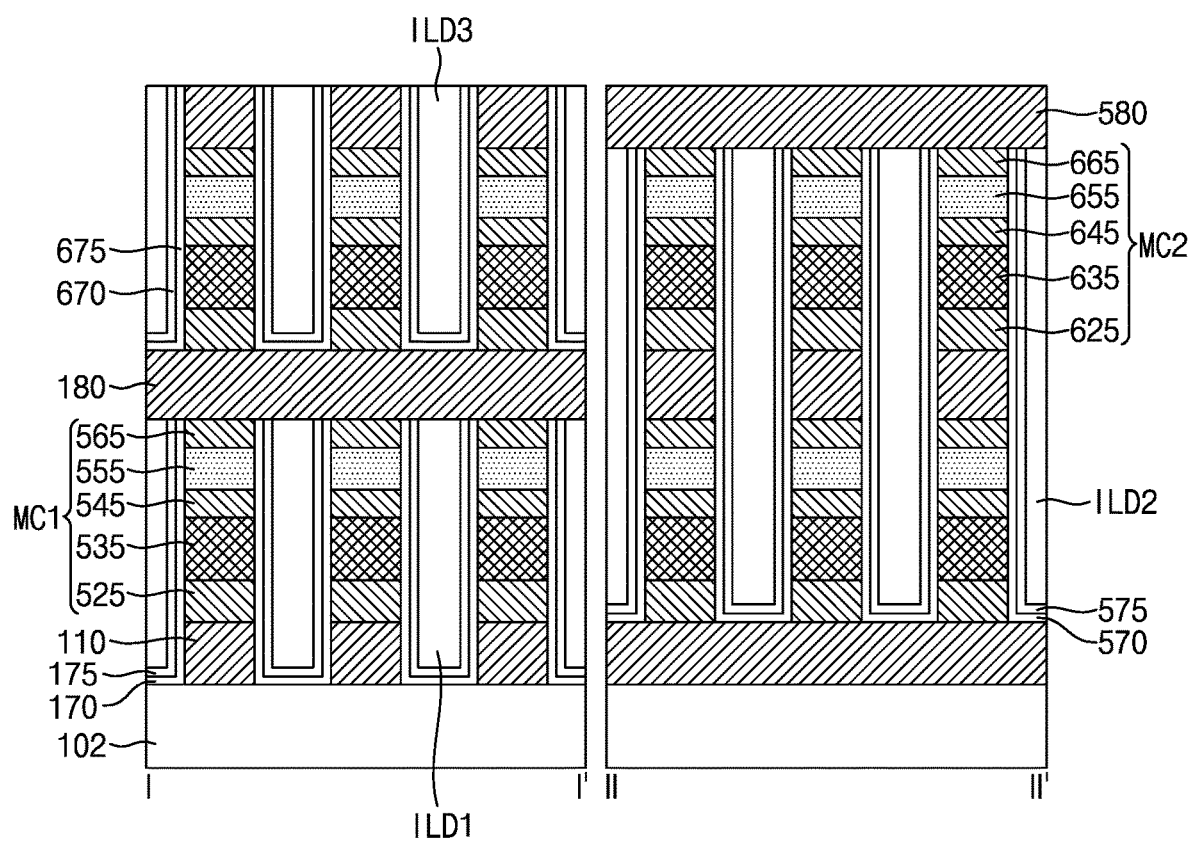
FIG. 13 is cross-sectional views illustrating a variable resistance memory device according to an exemplary embodiment of the present inventive concept.

FIG. 13 shows cross-sectional views of a variable resistance memory device according to an embodiment of the present inventive concept.

FIG. 13 illustrates a variable resistance memory device 100 having a cross-point cell array structure in which memory cells MC are disposed at intersections of conductive lines. As shown in FIG. 13, the memory cells MC in two layers may be stacked in a cross-point cell array, and a structure having three or more layers is also possible.

Referring to FIG. 13, the variable resistance memory device 100 according to the exemplary embodiment of the present inventive concept may include a first conductive line 110, a second conductive line 180, and a third conductive line 580. The first conductive line 110 may extend in the first direction (e.g., the D1 direction), the second conductive line 180 may extend in the second direction (e.g., the D2 direction), and the third conductive line 580 may extend in the first direction (e.g., the D1 direction). The first conductive line 110, the second conductive line 180, and the third conductive line 580 may be spaced apart from each other in a thickness direction (e.g., the D3 direction).

A first memory cell MC1 may be disposed between the first conductive line 110 and the second conductive line 180. For example, the first memory cell MC1 may be disposed at an intersection of the first conductive line 110 and the second conductive line 180. The first memory cell MC1 may include a first lower electrode 525, a first selection pattern 535, a first intermediate electrode 545, a first variable resistance pattern 555, and a first upper electrode 565 which are sequentially stacked. A space between a plurality of first memory cells MC1 may be filled with a first interlayer insulating layer ILD1. The first interlayer insulating layer ILD1 may extend in the first direction (e.g., the D1 direction). The second conductive line 180 may be disposed on the first interlayer insulating layer ILD1 and the first memory cell MC1. The first anti-oxidation layer 170 may surround the first memory cell MC1 and extend in the first direction (e.g., the D1 direction). A first anti-oxidation layer 170 may be disposed between the first memory cell MC1 and the first interlayer insulating layer ILD1 and may cover a lower surface of the first interlayer insulating layer ILD1. A first capping layer 175 may be disposed between the first interlayer insulating layer ILD1 and the first anti-oxidation layer 170.

A second memory cell MC2 may be disposed between the second conductive line 180 and the third conductive line 580. For example, the second memory cell MC2 may be disposed at an intersection of the second conductive line 180 and the third conductive line 580. The second memory cell MC2 may include a second lower electrode 625, a second selection pattern 635, a second intermediate electrode 645, a second variable resistance pattern 655, and a second upper electrode 665 which are sequentially stacked. When viewed from the cross-sectional view taken along line II-II', a space between a plurality of first memory cells MC1 may be filled with a second interlayer insulating layer ILD2. Further, a space between a plurality of second memory cells MC2 may be filled with the second interlayer insulating layer ILD2. The second interlayer insulating layer ILD2 may pass through the second conductive line 180 and extend in the second direction (e.g., the D2 direction). A second anti-oxidation layer 570 may surround the first memory cell MC1 and the second memory cell MC2 and extend in the second direction (e.g., the D2 direction). The second anti-oxidation layer 570 may be disposed between the second memory cell MC2 and the second interlayer insulating layer ILD2 and may cover a lower surface of the second interlayer insulating layer ILD2. The second capping layer 575 may be disposed between the second interlayer insulating layer ILD2 and the second anti-oxidation layer 570.

A space between the plurality of second memory cells MC2 may be filled with a third interlayer insulating layer ILD3, and the third interlayer insulating layer ILD3 may extend in the first direction (e.g., the D1 direction). A third anti-oxidation layer 670 may surround the second memory cell MC2 and extend in the first direction (e.g., the D1 direction). Further, the third anti-oxidation layer 670 may be disposed between the second memory cell MC2 and a third interlayer insulating layer ILD3 and may cover a lower surface of the third interlayer insulating layer ILD3. A third capping layer 675 may be disposed between the third interlayer insulating layer ILD3 and the third anti-oxidation layer 670. The third conductive line 580 may be disposed on the second memory cell MC2 and extend in the first direction (e.g., the D1 direction).

According to the exemplary embodiments of the present inventive concept, an anti-oxidation layer is formed on a variable resistor during the manufacturing process such that oxidation of the variable resistor can be prevented.

While the present inventive concept has been shown and described with reference to exemplary embodiments, it should be understood by those of ordinary skill in the art that various modifications may be made herein without departing from the spirit and scope of the present inventive concept as defined by the appended claims.

What is claimed is:

1. A variable resistance memory device, comprising:
   a plurality of lower electrodes disposed on a substrate;
   a plurality of variable resistors disposed on the plurality of lower electrodes;
   a plurality of upper electrodes disposed on the plurality of variable resistors;
   an interlayer insulating layer filling a space in the plurality of variable resistors; and
   an anti-oxidation layer disposed between the plurality of variable resistors and the interlayer insulating layer, the anti-oxidation layer covering side surfaces of the plurality of variable resistors,
   wherein the anti-oxidation layer covers a lower surface of the interlayer insulating layer and comprises silicon and/or carbon, and
   wherein the anti-oxidation layer includes SiCxHy.

2. The variable resistance memory device of claim 1, further comprising: a capping layer disposed between the interlayer insulating layer and the anti-oxidation layer.

3. The variable resistance memory device of claim 1, wherein a carbon content of the anti-oxidation layer is in a range of 25 atomic peace to 75 atomic percent.

4. The variable resistance memory device of claim 1, further comprising:
   first conductive lines disposed below the plurality of lower electrodes; and
   an insulating pattern disposed between the first conductive lines, wherein the anti-oxidation layer covers an upper surface of the insulating pattern.

5. The variable resistance memory device of claim 1, further comprising a selection pattern and an intermediate electrode which are sequentially stacked between the plurality of lower electrodes and the plurality of variable resistors, wherein each of the plurality of variable resistors comprises a variable resistance pattern comprising a chalcogenide material.

6. The variable resistance memory device of claim 5, further comprising the selection pattern comprising an ovonic threshold switch material of the chalcogenide series.

7. The variable resistance memory device of claim 5, further comprising a side spacer at least partially surrounding the variable resistance pattern, wherein the anti-oxidation layer at least partially surrounds the side spacer.

8. The variable resistance memory device of claim 1, wherein a thickness of the anti-oxidation layer is in a range of 2 Å to 20 Å.

9. The variable resistance memory device of claim 1, wherein the plurality of variable resistors comprises a first magnetic pattern, a tunnel barrier pattern, and a second magnetic pattern which are sequentially stacked.

10. The variable resistance memory device of claim 1, further comprising:
    first conductive lines disposed below the plurality of lower electrodes;
    an insulating pattern disposed between the first conductive lines; and
    a redeposition film provided on a side surface of at least one of the plurality of variable resistors,
    wherein the redeposition film comprises a same material as a material included in the insulating pattern.

11. The variable resistance memory device of claim 10, wherein the anti-oxidation layer covers an upper surface of the insulating pattern.

12. A variable resistance memory device, comprising:
    a plurality of word lines disposed on a substrate, each of the plurality of word lines extending primarily in a first direction;
    a plurality of hit lines disposed on the substrate, each of the plurality of bit lines extending primarily in a second direction intersecting the first direction;
    a plurality of memory cells at least one of which comprises a variable resistor, wherein the at least one memory cell is disposed at an intersection between the word lines and the bit lines;
    an interlayer insulating layer which fills a space between the plurality of memory cells;
    an anti-oxidation layer covering side surfaces of the memory cells; and
    a capping layer disposed on the anti-oxidation layer,
    wherein the anti-oxidation layer and the capping layer cover a lower surface of the interlayer insulating layer, and wherein the anti-oxidation layer comprises silicon and/or carbon, and
    wherein the anti-oxidation layer includes SiCxHy.

13. The variable resistance memory device of claim 12, further comprising an insulating pattern disposed between the word lines, wherein the anti-oxidation layer covers an upper surface of the insulating pattern.

14. The variable resistance memory device of claim 12, wherein the anti-oxidation layer covers at least a portion of an upper surface of the substrate.

15. The variable resistance memory device of claim 12, wherein the anti-oxidation layer covers at least a portion of an upper surface of each of the plurality of word lines.

16. The variable resistance memory device of claim 12, wherein the anti-oxidation layer covers at least a portion of a side surface of each of the plurality of bit lines.

* * * * *